US010332938B2

(12) United States Patent
Jeong et al.

(10) Patent No.: US 10,332,938 B2
(45) Date of Patent: Jun. 25, 2019

(54) DISPLAY PANEL CAPABLE OF REDUCING COLOR VARIATION AND METHOD OF MANUFACTURING THE SAME

(71) Applicant: SAMSUNG DISPLAY CO., LTD., Yongin-si, Gyeonggi-do (KR)

(72) Inventors: Jin-Tae Jeong, Suwon-si (KR); Yang-Wan Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 12 days.

(21) Appl. No.: 15/456,304

(22) Filed: Mar. 10, 2017

(65) Prior Publication Data

US 2017/0287986 A1    Oct. 5, 2017

(30) Foreign Application Priority Data

Apr. 5, 2016  (KR) .................... 10-2016-0041469

(51) Int. Cl.
*H01L 27/12*   (2006.01)
*H01L 27/32*   (2006.01)
*G09G 3/3225*  (2016.01)

(52) U.S. Cl.
CPC ........ *H01L 27/3211* (2013.01); *G09G 3/3225* (2013.01); *H01L 27/12* (2013.01);
(Continued)

(58) Field of Classification Search
CPC ............... H01L 27/124; H01L 27/3262; H01L 27/3276; H01L 27/326; H01L 27/3288
See application file for complete search history.

(56) References Cited

U.S. PATENT DOCUMENTS

2013/0256791 A1\* 10/2013 Iguchi ................. H01L 29/7813
                                                        257/331
2015/0103284 A1\*  4/2015 Nagasawa ......... G02F 1/134336
                                                        349/46
(Continued)

FOREIGN PATENT DOCUMENTS

KR   10-2013-0074147    7/2013
KR   10-2014-0018623    2/2014
(Continued)

*Primary Examiner* — Ngan V Ngo
(74) *Attorney, Agent, or Firm* — Lewis Roca Rothgerber Christie LLP

(57) ABSTRACT

A display panel includes a base substrate, an active pattern on the base substrate, and including a first active pattern of a first transistor, and a second active pattern of a second transistor, a gate pattern on the base substrate, and including a first gate electrode that overlaps the first active pattern, and a second gate electrode that overlaps the second active pattern, an insulation layer covering the gate pattern, a first conductive pattern on the insulation layer, and electrically connected to the first gate electrode through a first contact hole formed through the insulation layer, and a second conductive pattern electrically connected to the second gate electrode through a second contact hole formed through the insulation layer, wherein each of the first contact hole and the second contact hole overlaps, partially overlaps, or does not overlap each of the first active pattern and the second active pattern, and wherein a first overlapped area at which the first active pattern overlaps the first contact hole is different from a second overlapped area at which the second active pattern overlaps the second contact hole.

17 Claims, 27 Drawing Sheets

(52) U.S. Cl.
CPC .......... *H01L 27/124* (2013.01); *H01L 27/326* (2013.01); *H01L 27/3262* (2013.01); *H01L 27/3276* (2013.01); *H01L 27/3288* (2013.01); *G09G 2300/0819* (2013.01); *G09G 2310/0216* (2013.01); *G09G 2320/045* (2013.01)

(56) References Cited

U.S. PATENT DOCUMENTS

| | | | | |
|---|---|---|---|---|
| 2015/0206933 | A1* | 7/2015 | Koshihara | H01L 27/3276 257/40 |
| 2015/0316825 | A1* | 11/2015 | Lim | G02F 1/136286 257/72 |
| 2016/0126295 | A1* | 5/2016 | Sato | H01L 27/3218 257/89 |
| 2016/0293545 | A1* | 10/2016 | Yoon | H01L 23/5283 |
| 2016/0293608 | A1* | 10/2016 | Yoon | H01L 27/1104 |
| 2016/0300898 | A1* | 10/2016 | Kim | H01L 27/3262 |
| 2017/0146846 | A1* | 5/2017 | Funakoshi | G02F 1/133512 |
| 2017/0221937 | A1* | 8/2017 | Shim | G03F 1/38 |
| 2017/0242283 | A1* | 8/2017 | Oda | G02F 1/133345 |
| 2018/0013007 | A1* | 1/2018 | Sato | H01L 29/42384 |
| 2018/0069126 | A1* | 3/2018 | Sasaki | H01L 29/7869 |
| 2018/0120620 | A1* | 5/2018 | Shim | H01L 51/5228 |
| 2018/0182822 | A1* | 6/2018 | Seo | G06F 3/0416 |
| 2018/0190679 | A1* | 7/2018 | Inoue | G02F 1/1343 |
| 2018/0197924 | A1* | 7/2018 | Tada | H01L 27/323 |
| 2018/0219050 | A1* | 8/2018 | Ota | H01L 27/3211 |

FOREIGN PATENT DOCUMENTS

| | | |
|---|---|---|
| KR | 10-2014-0053602 | 5/2014 |
| KR | 10-2015-0007788 | 1/2015 |

\* cited by examiner

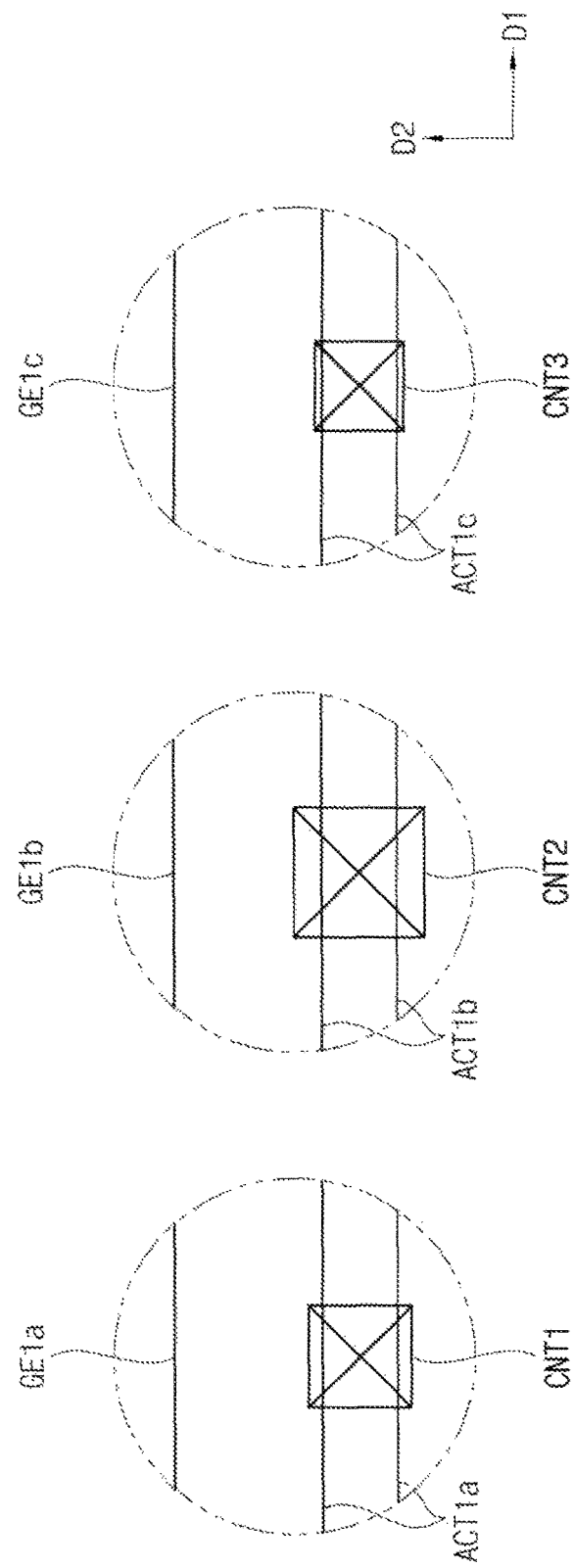

FIG. 9A
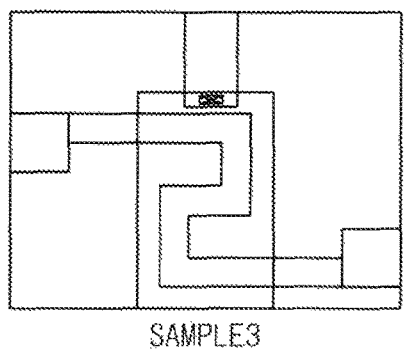
SAMPLE3
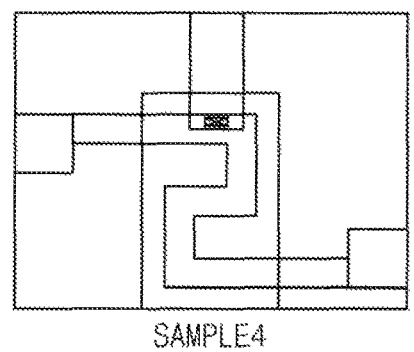
SAMPLE4
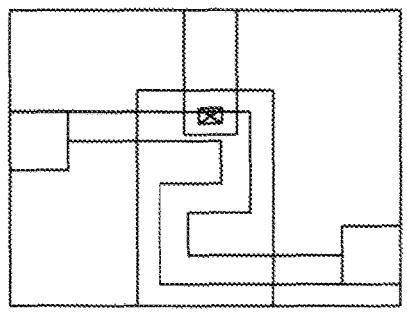
SAMPLE3
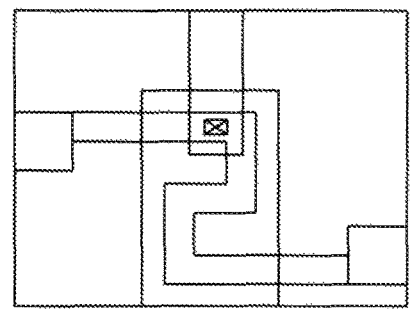
SAMPLE4

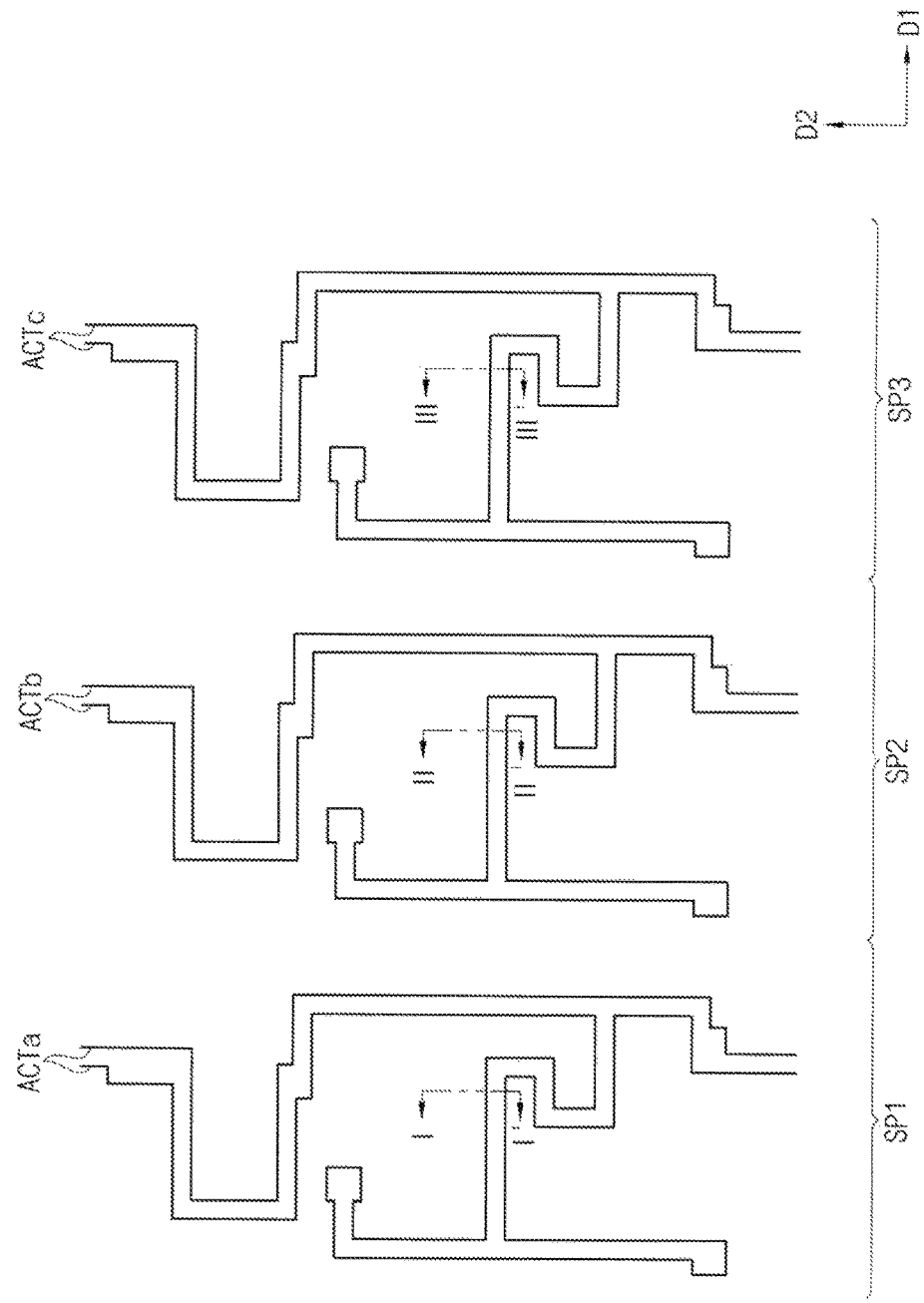

DISPLAY PANEL CAPABLE OF REDUCING COLOR VARIATION AND METHOD OF MANUFACTURING THE SAME

CROSS-REFERENCE TO RELATED APPLICATION

This application claims priority to, and the benefit of, Korean Patent Application No. 10-2016-0041469, filed on Apr. 5, 2016, the disclosure of which is incorporated by reference herein in its entirety.

BACKGROUND

1. Field

Embodiments of the inventive concept relate to a display panel capable of reducing color deviation/variation and improving display quality, and a method of manufacturing the same.

2. Description of the Related Art

A display device displays an image using a pixel that emits light. An organic light emitting display device includes the pixel having an organic light emitting diode (OLED). The OLED emits the light having a wavelength that depends on an organic material included in the OLED. For example, the OLED includes the organic material corresponding to one of a red color light, a green color light, and/or a blue color light. The organic light emitting display device displays the image by mixing the light emitted by the organic materials of different OLEDs.

Each of the organic materials corresponding to the red color light, the green color light, and the blue color light has a component that is different from the other organic materials, and each of the organic materials has luminance efficiency that is different from the other organic materials, so that there may be a problem of degradation of display quality due to driving voltage deviation/variation among the corresponding colors.

SUMMARY

One or more embodiment of the inventive concept provides a display panel capable of improving display quality.

One or more embodiments of the inventive concept also provide a method of manufacturing the display panel.

According to an embodiment of the inventive concept, a display panel includes a base substrate, an active pattern on the base substrate, and including a first active pattern of a first transistor, and a second active pattern of a second transistor, a gate pattern on the base substrate, and including a first gate electrode that overlaps the first active pattern, and a second gate electrode that overlaps the second active pattern, an insulation layer covering the gate pattern, a first conductive pattern on the insulation layer, and electrically connected to the first gate electrode through a first contact hole formed through the insulation layer, and a second conductive pattern electrically connected to the second gate electrode through a second contact hole formed through the insulation layer, wherein each of the first contact hole and the second contact hole overlaps, partially overlaps, or does not overlap each of the first active pattern and the second active pattern, and wherein a first overlapped area at which the first active pattern overlaps the first contact hole is different from a second overlapped area at which the second active pattern overlaps the second contact hole.

The display panel may further include a first light emitting structure electrically connected to the first transistor, and configured to emit a first color light, and a second light emitting structure electrically connected to the second transistor, and configured to emit a second color light.

A first distance between the first contact hole and the first active pattern may be different from a second distance between the second contact hole and the second active pattern.

The first contact hole may include at least one first sub-contact hole, the second contact hole may include at least one second sub-contact hole, and a number of the at least one first sub-contact hole may be different from a number of the at least one second sub-contact hole.

A size of the first contact hole may be different from a size of the second contact hole.

The display panel may further include a third conductive pattern electrically connected to a third gate electrode of a third transistor through a third contact hole formed through the insulation layer, wherein the active pattern further includes a third active pattern of the third transistor, wherein the gate pattern further includes the third gate electrode of the third transistor, wherein the third contact hole overlaps, partially overlaps, or does not overlap the third active pattern, and wherein the first overlapped area, the second overlapped area, and a third overlapped area at which the third active pattern overlaps the third contact hole are different from each other.

The display panel may further include a first light emitting structure electrically connected to the first transistor, and configured to emit a first color light, a second light emitting structure electrically connected to the second transistor, and configured to emit a second color light, and a third light emitting structure electrically connected to the third transistor, and configured to emit a third color light.

The first color light may be red light, the second color light may be green light, and the third color light may be blue light.

A second distance between the second contact hole and the second active pattern may be greater than a first distance between the first contact hole and the first active pattern, and a third distance between the third contact hole and the third active pattern may be greater than the first distance.

The first contact hole may include at least one first sub-contact hole, the second contact hole may include at least one second sub-contact hole, the third contact hole may include at least one third sub-contact hole, and a number of the at least one second sub-contact hole may be greater than a number of the at least one first sub-contact hole, which may be greater than a number of the at least one third sub-contact hole.

A size of the second contact hole may be greater than a size of the first contact hole, which may be greater than a size of the third contact hole.

The second overlapped area may be greater than the first overlapped area, and the first overlapped area may be greater than the third overlapped area.

The first contact hole may overlap the first active pattern, and the second contact hole might not overlap the second active pattern.

The display panel may further include a data line on the base substrate at a same layer as the first conductive pattern and the second conductive pattern.

The display panel may further include a storage electrode line overlapping the first gate electrode and the second gate electrode, and defining openings corresponding to the first and second contact holes.

According to an embodiment of the inventive concept, a method of manufacturing a display panel includes forming a first transistor including a first gate electrode and a first active pattern on a base substrate, forming a second transistor including a second gate electrode and a second active pattern on the base substrate, forming an insulation layer on the first and second gate electrodes, forming a first contact hole that exposes the first gate electrode through the insulation layer, forming a second contact hole that exposes the second gate electrode through the insulation layer, forming first conductive pattern that is electrically connected to the first gate electrode through the first contact hole, forming a second conductive pattern that is electrically connected to the second gate electrode through the second contact hole, forming a first light emitting structure electrically connected to the first transistor, and configured to emit a first color light, and forming a second light emitting structure electrically connected to the second transistor, and configured to emit a second color light, wherein a first overlapped area at which the first active pattern overlaps the first contact hole is different from a second overlapped area at which the second active pattern overlaps the second contact hole.

A size of the first contact hole may be different from a size of the second contact hole, or a relative position of the first contact hole with respect to the first active pattern may be different from a relative position of the second contact hole with respect to the second active pattern.

The first contact hole may include at least one first sub-contact hole, the second contact hole may include at least second one sub-contact hole, and a first number of the at least on first sub-contact hole may be different from a second number of the at least on second sub-contact hole.

The method may further include forming a third transistor including a third gate electrode and a third active pattern, forming a third contact hole that exposes the third gate electrode through the insulation layer, and forming a third light emitting structure electrically connected to the third transistor and configured to emit a third color light, and the second overlapped area may be greater than the first overlapped area, which may be in turn greater than a third overlapped area at which the third active pattern overlaps the third contact hole.

According to an embodiment of the inventive concept, a display panel includes first and second sub-pixels that emit different color light, wherein the first sub-pixel includes a first transistor including a first gate electrode, wherein the second sub-pixel includes a second transistor including a second gate electrode, wherein a size of the first transistor is substantially the same as a size of the second transistor, and wherein a relative position of a first contact hole that exposes the first gate electrode in the first transistor is different from relative position of a second contact hole that exposes the second gate electrode in the second transistor.

According to the present inventive concept, a display panel includes a first sub-pixel which includes a first transistor, a second sub-pixel which includes a second transistor and a third sub-pixel which includes a third transistor. Each of the first to third transistors includes gate electrode, and the gate electrode may be electrically connected to other elements through first to third contact holes. Relative positions of the first to third contact holes in each of the sub-pixels may be set to be different from each other. Thus, even though the sub-pixels have luminous efficiency different from each other, deviation or variation of data voltage ranges for the sub-pixels may be minimized by setting the positions of the contact holes. Accordingly, color deviation or color variation of a display apparatus may be reduced, so that display quality may be improved.

BRIEF DESCRIPTION OF THE DRAWINGS

The above and other features of the inventive concept will become more apparent by describing in detail embodiments thereof with reference to the accompanying drawings, in which:

FIGS. 6 to 8 are enlarged views illustrating a portion of display panel surrounding first to third contact holes according to some embodiments of the inventive concept;

FIGS. 9A and 9B are figures and a graph illustrating DR range of thin film transistors according to position of a contact hole; and FIGS. 10 to 19C are plan views and cross-sectional views illustrating a method of manufacturing the display panel of FIG. 1.

DETAILED DESCRIPTION

Figure 1:
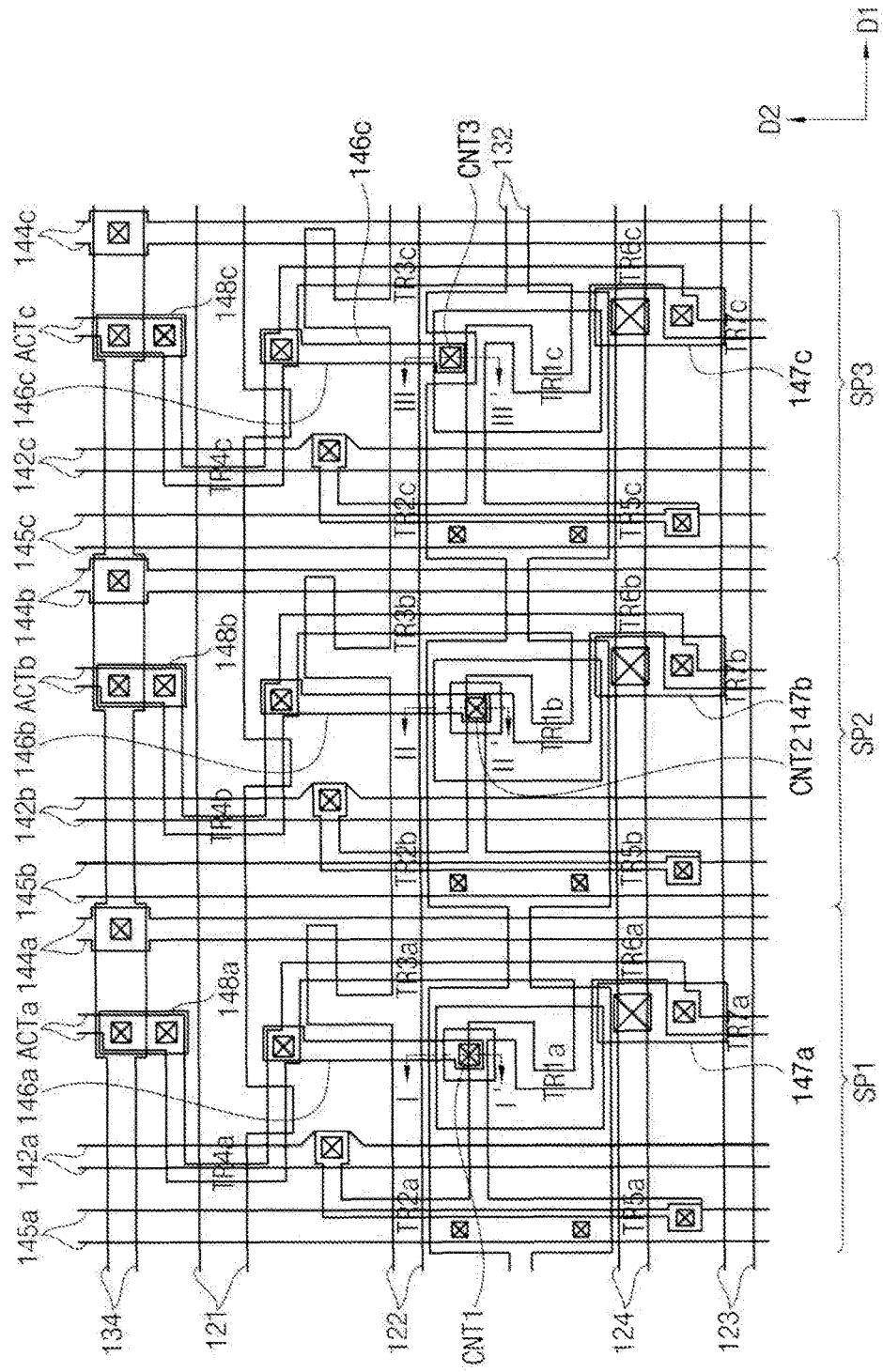
FIG. 1 is a plan view illustrating a display panel according to an embodiment of the inventive concept.

Features of the inventive concept and methods of accomplishing the same may be understood more readily by reference to the following detailed description of embodiments and the accompanying drawings. Hereinafter, embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2A:
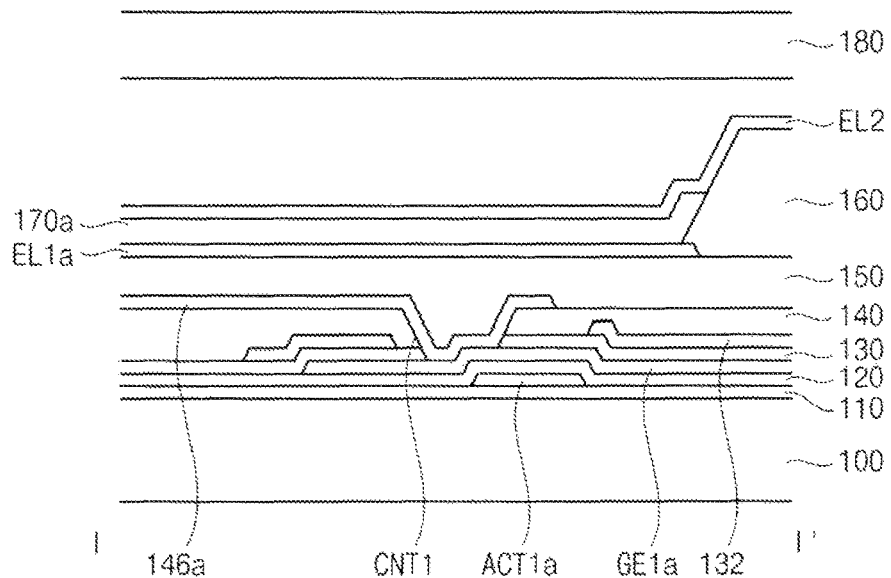
FIG. 2A is a cross-sectional view taken along the line I-I' of FIG. 1.
Figure 2B:
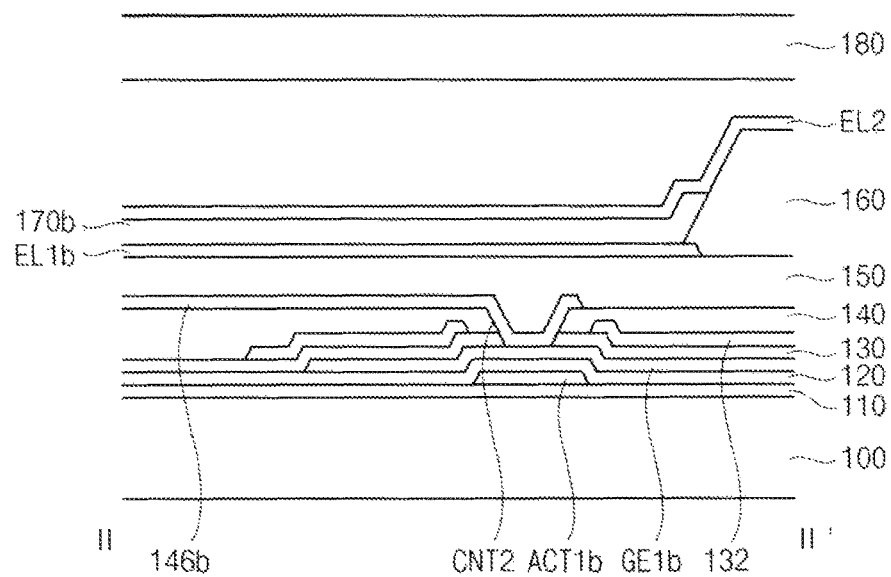
FIG. 2B is a cross-sectional view taken along the line II-II' of FIG. 1.
Figure 2C:
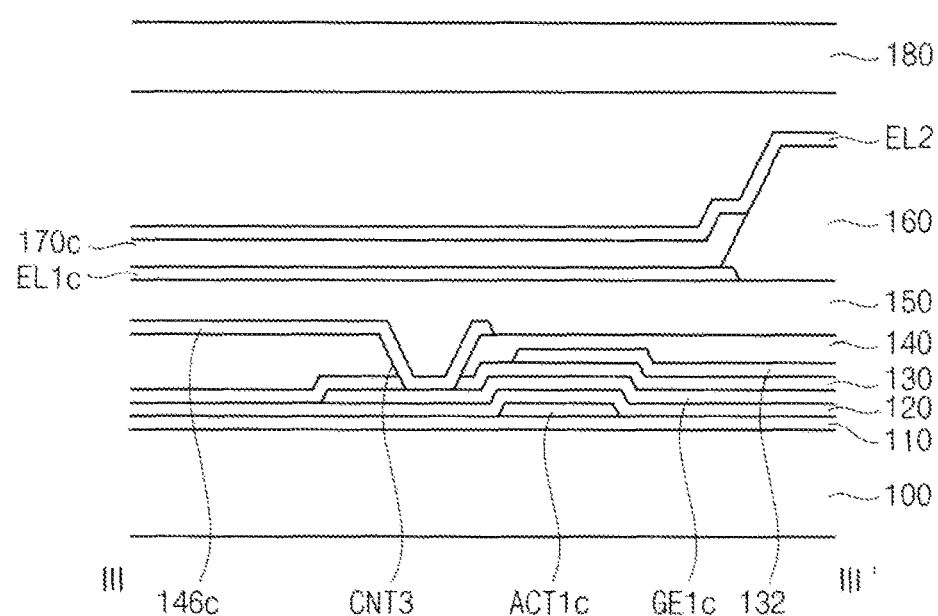
FIG. 2C is a cross-sectional view taken along the line III-III' of FIG. 1.

FIG. 1 is a plan view illustrating a display panel according to an embodiment of the inventive concept. FIG. 2A is a cross-sectional view taken along the line I-I' of FIG. 1. FIG. 2B is a cross-sectional view taken along the line II-II' of FIG. 1. FIG. 2C is a cross-sectional view taken along the line III-III' of FIG. 1.

Referring to FIGS. 1 to 2C, the display panel includes a plurality of unit pixels. Each of the unit pixels includes a first sub-pixel SP1, a second sub-pixel SP2, and a third sub-pixel SP3.

The display panel may include a base substrate 100, a buffer layer 110, an active pattern ACTa, ACTb, and ACTc, a first insulation layer 120, a first gate pattern, a second insulation layer 130, a second gate pattern, a third insulation layer 140, a data pattern, a planarization layer 150, a first electrode EL1a, EL1b, and EL1c, a pixel defining layer 160, a light emitting structure 170a, 170b, and 170c, a second electrode EL2, and a sealing substrate 180.

The first sub-pixel SP1, the second sub-pixel SP2, and the third sub-pixel SP3 may have substantially the same structure, with the exception of first to third contact holes CNT1, CNT2, and CNT3. Thus, only the first sub-pixel SP1 will be described representatively in detail hereinafter.

The base substrate 100 may include a transparent insulation substrate. For example, the base substrate 100 may include a glass substrate, a quartz substrate, a transparent resin substrate, etc. Examples of the transparent resin substrate for the base substrate 100 may include polyimide-based resin, acryl-based resin, polyacrylate-based resin, polycarbonate-based resin, polyether-based resin, sulfonic acid containing resin, polyethyleneterephthalate-based resin, etc.

The buffer layer 110 may be located on the base substrate 100. The buffer layer 110 may prevent diffusion of metal atoms and/or impurities from the base substrate 100. In case the base substrate 100 has a relatively irregular surface, the buffer layer 110 may planarize, or may improve flatness, of the surface of the base substrate 100. The buffer layer 110 may be formed using a silicon compound. For example, the buffer layer 110 may include silicon oxide (SiOx), silicon nitride (SiNx), silicon oxynitride (SiOxNy), silicon oxycarbide (SiOxCy), silicon carbon nitride (SiCxNy), etc. These may be used alone or in a mixture thereof. The buffer layer 110 may have a single-layered structure or a multi-layer structure. For example, the buffer layer 110 may have a single-layered structure including a silicon oxide film, a silicon nitride film, a silicon oxynitride film, a silicon oxycarbide film, or a silicon carbon nitride film. Alternatively, the buffer layer 110 may have a multi-layer structure including at least two of a silicon oxide film, a silicon nitride film, a silicon oxynitride film, a silicon oxycarbide film, a silicon carbon nitride film, etc.

The active pattern ACTa may be located on the buffer layer 110. In one embodiment, the active pattern ACTa may include silicon (Si). In another embodiment, the active pattern ACTa may include a semiconductor oxide containing a binary compound (ABx), a ternary compound (ABxCy) and/or a quaternary compound (ABxCyDz). For example, the active pattern ACTa may include indium (In), zinc (Zn), gallium (Ga), stannum (Sn), titanium (Ti), aluminum (Al), hafnium (Hf), zirconium (Zr) and/or magnesium (Mg).

The active pattern ACTa may include a first active area ACT1a, a first electrode, and a second electrode of a first transistor TR1a, an active area, a first electrode, and a second electrode of a second transistor TR2a, an active area, a first electrode, and a second electrode of a third transistor TR3a, an active area, a first electrode, and a second electrode of a fourth transistor TR4a, an active area, a first electrode, and a second electrode of a fifth transistor TR5a, an active area, a first electrode, and a second electrode of a sixth transistor TR6a, and an active area, a first electrode, and a second electrode of a seventh transistor TR7a. Similarly, the active pattern ACTb may include a second active area ACT1b of a second transistor, and the active pattern ACTc may include a third active area ACT1c of a third transistor.

The first insulation layer 120 may be located on the buffer layer 110 to cover the active pattern ACTa. The first insulation layer 120 may include a silicon compound, metal oxide, etc. For example, the first insulation layer 120 may be formed using silicon oxide (SiOx), silicon nitride (SiNx), silicon oxynitride (SiOxNy), aluminum oxide (AlOx), tantalum oxide (TaOx), hafnium oxide (HfOx), zirconium oxide (ZrOx), titanium oxide (TiOx), etc. These may be used alone or in a combination thereof. In addition, the first insulation layer 120 may have a single layer structure or a multi-layer structure including the silicon oxide and/or the silicon nitride. In embodiments, the first insulation layer 120 may be uniformly formed on the buffer layer 110 along a profile of the active pattern ACTa. Here, the first insulation layer 120 may have a substantially small thickness, such that a stepped portion may be formed at a portion of the first insulation layer 120 adjacent to the active pattern ACTa. In some embodiments, the first insulation layer 120 may have a relatively large thickness for sufficiently covering the active pattern ACTa, so that the first insulation layer 120 may have a substantially level surface.

The first gate pattern may be located on the first insulation layer 120. The first gate pattern may include metal, alloy, conductive metal oxide, a transparent conductive material, etc. For example, the first gate pattern may be formed using aluminum (Al), alloy containing aluminum, aluminum nitride (AlNx), silver (Ag), alloy containing silver, tungsten (W), tungsten nitride (WNx), copper (Cu), alloy containing copper, nickel (Ni), alloy containing nickel, chrome (Cr), chrome nitride (CrNx), molybdenum (Mo), alloy containing molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), tin oxide (SnOx), indium oxide (InOx), gallium oxide (GaOx), indium zinc oxide (IZO), etc. These may be used alone or in a combination thereof. In embodiments, the first gate pattern may have a single layer structure or a multi-layer structure, which may include a metal film, an alloy film, a metal nitride film, a conductive metal oxide film, and/or a transparent conductive film.

The first gate pattern may include a data initialization line 121, a scan line 122, a bypass control line 123, an emission control line 124, and a first gate electrode GE1a of the first transistor TR1a.

The data initialization line 121 may extend in a first direction D1. A data initialization signal (refer to GI of FIG. 3) may be applied to the data initialization line 121. The data initialization signal may be identical to a previous scan signal that is previous to a current scan signal by one horizontal time. The data initialization line 121 may be electrically connected to a gate electrode of the fourth transistor TR4a. For example, the gate electrode of the fourth transistor TR4a may be a portion of the data initialization line 121.

The scan line 122 may extend in the first direction D1, so that the scan line 122 is parallel to the data initialization line 121. A (current) scan signal (refer to GW of FIG. 3) may be applied to the scan line 122. The scan line 122 may be electrically connected to a gate electrode of the second transistor TR2a. For example, the gate electrode of the second transistor TR2a may be a portion of the scan line 122. The scan line 122 may be electrically connected to a gate electrode of the third transistor TR3a. For example, the gate electrode of the third transistor TR3a may be a portion of the scan line 122.

The bypass control line 123 may extend in the first direction D1, so that the bypass control line 123 is parallel to the scan line 122. A diode initialization signal (refer to GB of FIG. 3) may be applied to the bypass control line 123. The bypass control line 123 may be electrically connected to a gate electrode of the seventh transistor TR7a. For example, the gate electrode of the seventh transistor TR7a may be a portion of the bypass control line 123.

The emission control line 124 may extend in the first direction D1, so that the emission control line 124 is parallel to the scan line 122. An emission signal (refer to EM of FIG. 3) may be applied to the emission control line 124. The emission control line 124 may be electrically connected to a gate electrode of the fifth transistor TR5a. For example, the gate electrode of the fifth transistor TR5a may be a portion of the emission control line 124. The emission control line 124 may be electrically connected to a gate electrode of the sixth transistor TR6a. For example, the gate electrode of the sixth transistor TR6a may be a portion of the emission control line 124.

The first gate electrode GE1a may be the gate electrode of the first transistor TR1a. Thus, the first gate electrode GE1a may overlap the first active area ACT1a of the transistor TR1a.

The second insulation layer 130 may be located on the first insulation layer 120 on which the first gate pattern is located. The second insulation layer 130 may be uniformly formed on the first insulation layer 120 along a profile of the first gate pattern. Here, the second insulation layer 130 may have a substantially small thickness, such that a stepped portion may be formed at a portion of the second insulation layer 130 adjacent to the first gate pattern. The second insulation layer 130 may include a silicon compound. For example, the second insulation layer 130 may be formed using silicon oxide (SiOx), silicon nitride (SiNx), silicon oxynitride (SiOxNy), silicon oxycarbide (SiOxCy), silicon carbon nitride (SiCxNy), etc. These may be used alone or in a mixture thereof.

The second gate pattern may be located on the second insulation layer 130. The second gate pattern may include metal, alloy, conductive metal oxide, a transparent conductive material, etc. For example, the second gate pattern may be formed using aluminum (Al), alloy containing aluminum, aluminum nitride (AlNx), silver (Ag), alloy containing silver, tungsten (W), tungsten nitride (WNx), copper (Cu), alloy containing copper, nickel (Ni), alloy containing nickel, chrome (Cr), chrome nitride (CrNx), molybdenum (Mo), alloy containing molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), tin oxide (SnOx), indium oxide (InOx), gallium oxide (GaOx), indium zinc oxide (IZO), etc. These may be used alone or in a combination thereof. In embodiments, the second gate pattern may have a single layer structure or a multi-layer structure, which may include a metal film, an alloy film, a metal nitride film, a conductive metal oxide film and/or a transparent conductive film.

The second gate pattern may include a storage electrode line 132 and an auxiliary initialization voltage line 134.

The storage electrode line 132 may extend in the first direction D1. The storage electrode line 132 may overlap the first gate electrode GE1a to form a storage capacitor (refer to CST of FIG. 3). The storage electrode line 132 may have openings that expose first to third contact holes CNT1, CNT2, and CNT3, which will be described later.

The auxiliary initialization voltage line 134 may extend in the first direction D1. Thus, the auxiliary initialization voltage line 134 may be parallel to the storage electrode line 132.

The third insulation layer 140 may be located on the second insulation layer 130 on which the second gate pattern is located. The third insulation layer 140 may have a relatively large thickness for sufficiently covering the second gate pattern, so that the third insulation layer 140 may have a substantially level surface. In other embodiments, the third insulation layer 140 may be uniformly formed on the second insulation layer 130 along a profile of the second gate pattern. Here, the third insulation layer 140 may have a substantially small thickness, such that a stepped portion may be formed at a portion of the third insulation layer 140 adjacent, and corresponding to, the second gate pattern. The third insulation layer 140 may include a silicon compound. For example, the third insulation layer 140 may be formed using silicon oxide (SiOx), silicon nitride (SiNx), silicon oxynitride (SiOxNy), silicon oxycarbide (SiOxCy), silicon carbon nitride (SiCxNy), etc. These may be used alone or in a mixture thereof.

The data pattern may be located on the third insulation layer 140. The data pattern may include metal, alloy, conductive metal oxide, a transparent conductive material, etc. For example, the data pattern may be formed using aluminum (Al), alloy containing aluminum, aluminum nitride (AlNx), silver (Ag), alloy containing silver, tungsten (W), tungsten nitride (WNx), copper (Cu), alloy containing copper, nickel (Ni), alloy containing nickel, chrome (Cr), chrome nitride (CrNx), molybdenum (Mo), alloy containing molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), tin oxide (SnOx), indium oxide (InOx), gallium oxide (GaOx), indium zinc oxide (IZO), etc. These may be used alone or in a combination thereof. In embodiments, the data pattern may have a single-layered structure or a multi-layer structure, which may include a metal film, an alloy film, a metal nitride film, a conductive metal oxide film, and/or a transparent conductive film.

The data pattern may include a data line 142a, an initialization voltage line 144a, a driving voltage line 145a, a first connecting electrode 146a, a second connecting electrode 147a, and a third connecting electrode 148a.

The data line 142a may extend in a second direction D2 that crosses the first direction D1. The second direction D2 may be substantially perpendicular to the first direction D1. A data signal (refer to DATA of FIG. 3) may be applied to the data line 142a.

The data line 142a may be electrically connected to the active pattern ACTa through a contact hole formed through, or defined by, the first to third insulation layers 120, 130, and 140. Thus, the data line 142a may be electrically connected to the first electrode of the second transistor TR2a.

The initialization voltage line 144a may extend in the second direction D2. Thus, the initialization voltage line 144a may be parallel to the data line 142a. An initialization voltage (refer to VINT of FIG. 3) may be applied to the initialization voltage line 144a.

The initialization voltage line 144a may be electrically connected to the auxiliary initialization voltage line 134 through a contact hole formed through the third insulation layer 140. In addition, the auxiliary initialization voltage line 134 may be electrically connected to the third connecting electrode 148a though a contact hole formed through the third insulation layer 140. The third connecting electrode 148a may be electrically connected to the active pattern ACTa through a contact hole formed through the first to third insulation layers 120, 130 and 140. Thus, the initialization voltage line 144a may be electrically connected to the first electrode of the fourth transistor TR4a.

The driving voltage line 145a may extend in the second direction D2. Thus, the driving voltage line 145a may be parallel to the data line 142a. A first power voltage (refer to ELVDD of FIG. 3) may be applied to the driving voltage line 145a.

The driving voltage line 145a may be electrically connected to the active pattern ACTa through a contact hole formed through, or defined by, the first to third insulation layers 120, 130 and 140. Thus, the driving voltage line 145a may be electrically connected to the first electrode of the fifth transistor TR5a. The driving voltage line 145a may be electrically connected to the storage electrode line 132 though a contact hole formed through the third insulation layer 140. Thus, the driving voltage line 145a may be electrically connected to the storage capacitor.

The first connecting electrode 146a may be electrically connected to the active pattern ACTa through a contact hole formed through the first to third insulation layers 120, 130 and 140. The first connecting electrode 146a may be electrically connected to the first gate electrode GE1a through a first contact hole CNT1 formed through, or defined by, the second and third insulation layers 130 and 140. Thus, the first connecting electrode 146a may be electrically connected to the gate electrode of the first transistor TR1a, the second electrode of the fourth transistor TR4a, the first electrode of the third transistor TR3a, and the storage capacitor.

In addition, in the first sub-pixel SP1, the first contact hole CNT1 may be formed to overlap a portion of the first active pattern ACT1a. In the second sub-pixel SP2, the second contact hole CNT2 may be formed to entirely overlap the second active pattern ACT1b. In the third sub-pixel SP3, the third contact hole CNT3 may be formed to not overlap the third active pattern ACT1c. Thus, a distance between the second active pattern ACT1b and the second contact hole CNT2 in the second sub-pixel SP2 is smaller than a corresponding distance in the first and third sub-pixels SP1 and SP3, and the distance between the first active pattern ACT1a and the first contact hole CNT1 in the first sub-pixel SP1 is smaller than the distance between the third active pattern ACT1c and the third contact hole CNT3 in the third sub-pixel SP3.

The second connecting electrode 147a may be electrically connected to the first active pattern ACT1a though a contact hole formed through, or defined by, the first, second, and third insulation layers 120, 130, and 140. Thus, the second connecting electrode 147a may be electrically connected to the second electrode of the sixth transistor TR6a and connected to the second electrode of the seventh transistor TR7a.

The planarization layer 150 may be located on the third insulation layer 140 on which the data pattern is located. The planarization layer 150 may have a single-layered structure, or may have a multi-layered structure including at least two insulation films. The planarization layer 150 may be formed using an organic material. For example, the planarization layer 150 may include photoresist, acryl-based resin, polyimide-based resin, polyamide-based resin, siloxane-based resin, etc. These may be used alone or in a combination thereof. Alternatively, the planarization layer 150 may include an inorganic material. For example, the planarization layer 150 may be formed using silicon oxide, silicon nitride, silicon oxynitride, silicon oxycarbide, aluminum, magnesium, zinc, hafnium, zirconium, titanium, tantalum, aluminum oxide, titanium oxide, tantalum oxide, magnesium oxide, zinc oxide, hafnium oxide, zirconium oxide, titanium oxide, etc. These may be used alone or in a mixture thereof.

The first electrode EL1a may be located on the planarization layer 150. The first electrode EL1a may be electrically connected to the second connecting electrode 147a through a via hole formed through, or defined in, the planarization layer 150. The first electrode EL1a may include a reflective material or a transmissive material in accordance with the emission type of the display apparatus. For example, the first electrode EL1a may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. In embodiments, the first electrode EL1a may have a single-layered structure or a multi-layer structure, which may include a metal film, an alloy film, a metal nitride film, a conductive metal oxide film and/or a transparent conductive film.

The pixel defining layer 160 may be located on the planarization layer 150 on which the first electrode EL1a is located. The pixel defining layer 160 may include an organic material or an inorganic material. For example, the pixel defining layer 160 may be formed using photoresist, acryl-based resin, polyacryl-based resin, polyimide-based resin, a silicon compound, etc. In embodiments, the pixel defining layer 160 may be partially etched to form an opening partially exposing the first electrode EL1a. The opening of the pixel defining layer 160 may define a luminescent region and a non-luminescent region of the display apparatus. For example, a portion of the display apparatus having the opening of the pixel defining layer 160 may be the luminescent region of the display device, while another portion of, or a remainder of, the display apparatus that is around the opening of the pixel defining layer 160 may be the non-luminescent region of the display device.

The light emitting structure 170a may be positioned on the first electrode EL1a, which is exposed by the opening of the pixel defining layer 160. The light emitting structure 170a may extend on a sidewall of the opening of the pixel defining layer 160. The light emitting structure 170a may be formed by a laser induced thermal imaging process, a printing process, etc. The light emitting structure 170a may include an organic light emitting layer (EL), a hole injection layer (HIL), a hole transfer layer (HTL), an electron transfer layer (ETL), an electron injection layer (EIL), etc.

As an example, the organic light emitting layer of the light emitting structure 170a in the first sub-pixel SP1 may be formed using light emitting materials for generating red light, the organic light emitting layer of the light emitting structure 170b in the second sub-pixel SP2 may be formed using light emitting materials for generating green light, and the organic light emitting layer of the light emitting structure 170c in the third sub-pixel SP3 may be formed using light emitting materials for generating blue light.

The second electrode EL2 may be located on the light emitting structure 170a and on the pixel defining layer 160. The second electrode EL2 may include a transmissive material or a reflective material in accordance with the emission type of the display device. For example, the second electrode EL2 may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. In embodiments, the second electrode EL2 may also have a single layer structure or a multi-layer structure, which may include a metal film, an alloy film, a metal nitride film, a conductive metal oxide film, and/or a transparent conductive film.

The sealing substrate 180 may be located on the second electrode EL2. The sealing substrate 180 may include transparent material, and may be configured to reduce or prevent ambient air and moisture from permeating into the transparent organic light emitting display apparatus. The sealing substrate 180 may be combined to the base substrate 100 to seal space between the base substrate 100 and the sealing substrate 180 by a sealing agent. A desiccant or a filler may be filled into the space between the base substrate 100 and the sealing substrate 180.

In some embodiment, a thin sealing film instead of the sealing substrate 180 may be formed on the second electrode EL2 to protect the second electrode EL2 and the light emitting structure form ambient air and moisture. The sealing film may have a structure in which a layer formed of an inorganic material, such as silicon oxide or silicon nitride, and another layer, such as epoxy or polyimide, are alternately stacked. However other embodiments are not limited thereto, and the structure of the sealing film may be any sealing structure in the form of a transparent thin film.

Figure 3:
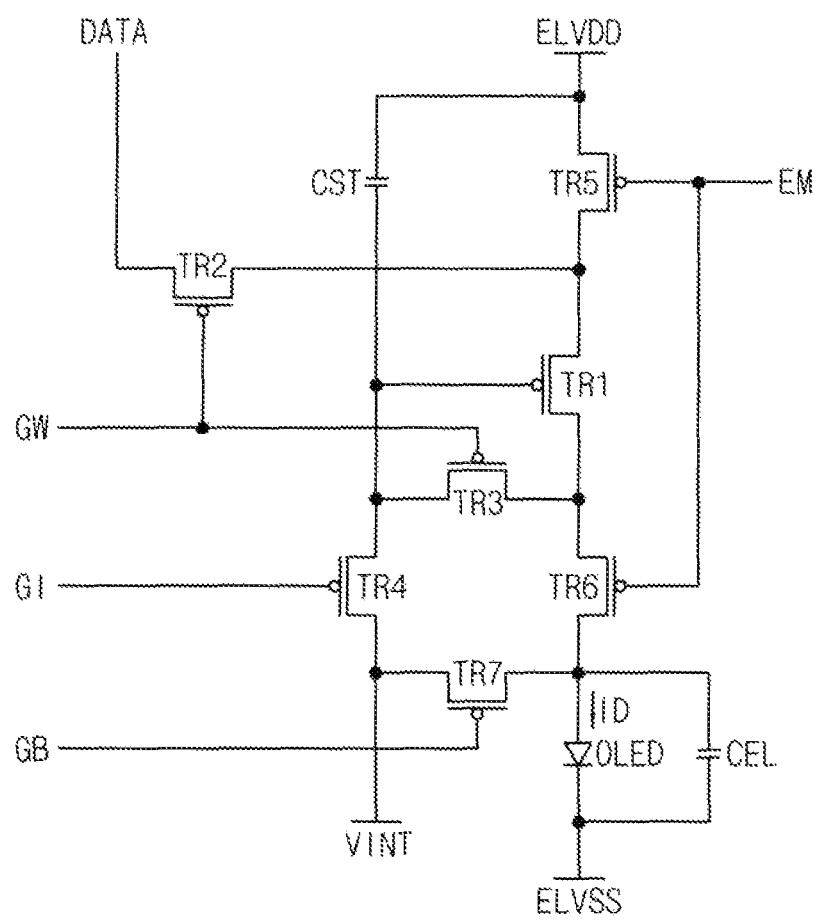
FIG. 3 is an equivalent circuit diagram illustrating a pixel of the display panel of FIG. 1.

FIG. 3 is an equivalent circuit diagram illustrating a pixel of the display panel of FIG. 1.

Referring to FIGS. 1 and 3, each of the first to third sub-pixels SP1, SP2, and SP3 of the display panel may correspond to a substantially similar equivalent circuit diagram. Thus, only one pixel will be described below.

The pixel may include an OLED, a first transistor TR1, a second transistor TR2, a third transistor TR3, a storage capacitor CST, a fourth transistor TR4, a fifth transistor TR5, a sixth transistor TR6, a seventh transistor TR7, and a diode parallel capacitor CEL. The diode parallel capacitor CEL may be a parasitic capacitor(s), or a parasitic capacitance.

The OLED may emit the light based on a driving current ID. The OLED may include a first electrode and a second electrode. In one embodiment, a second power voltage ELVSS may be applied to the second electrode of the OLED. In one embodiment, the first electrode of the OLED may be an anode electrode, and the second electrode of the OLED may be a cathode electrode. In another embodiment, the first electrode of the OLED may be the cathode electrode, and the second electrode of the OLED may be the anode electrode.

The first transistor TR1 may include a gate electrode, a first electrode, and a second electrode. In one embodiment, the first electrode of the first transistor TR1 may be a source electrode, and the second electrode of the first transistor TR1 may be a drain electrode. In another embodiment, the first electrode of the first transistor TR1 may be a drain electrode, and the second electrode of the first transistor TR1 may be a source electrode.

The first transistor TR1 may generate the driving current ID. In one embodiment, the first transistor TR1 may operate in a saturation region. In this case, the first transistor TR1 may generate, or supply, the driving current ID based on a voltage difference between the gate electrode of the first transistor TR1 and the source electrode of the first transistor TR1. The grayscale may correspond to the driving current ID provided to the OLED. In another embodiment, the first transistor TR1 may operate in a linear region. In this case, the grayscale may correspond to a time length in which the driving current ID is provided to the OLED.

The second transistor TR2 may include a gate electrode, a first electrode, and a second electrode. A scan signal (e.g., GW) may be applied to the gate electrode. A data signal (e.g., DATA) may be applied to the first electrode. The second electrode of the second transistor TR2 may be connected to the first electrode of the first transistor TR1. In one embodiment, the first electrode of the second transistor TR2 may be a source electrode, and the second electrode of the second transistor TR2 may be a drain electrode. In another embodiment, the first electrode of the second transistor TR2 may be a drain electrode, and the second electrode of the second transistor TR2 may be a source electrode.

The second transistor TR2 may provide the data signal DATA to the first electrode of the first transistor TR1 when the scan signal GW is supplied to the gate electrode of the second transistor TR2. The second transistor TR2 may operate in the linear region.

The third transistor TR3 may include a gate electrode, a first electrode, and a second electrode. The scan signal GW may be applied to the gate electrode of the third transistor TR3. The first electrode of the third transistor TR3 may be connected to the second electrode of the first transistor TR1. The second electrode of the third transistor TR3 may be connected to the gate electrode of the first transistor TR1. In one embodiment, the first electrode of the third transistor TR3 may be a source electrode, and the second electrode of the third transistor TR3 may be a drain electrode. In another embodiment, the first electrode of the third transistor TR3 may be a drain electrode, and the second electrode of the third transistor TR3 may be a source electrode.

The third transistor TR3 may connect the gate electrode of the first transistor TR1 to the second electrode of the first transistor TR1 while the scan signal GW is supplied to the gate electrode of the third transistor TR3. The third transistor TR3 may operate in a linear region. Thus, the third transistor TR3 may form a diode connection of the first transistor TR1 while the scan signal GW is activated. The voltage difference between the first electrode of the first transistor TR1 and the gate electrode of the first transistor TR1, which corresponds to a threshold voltage of the first transistor TR1, may result from the diode connection. In result, a sum voltage that is a sum of the data signal DATA provided to the first electrode of the first transistor TR1 and the voltage difference (i.e., the threshold voltage of the first transistor TR1) may be applied to the gate electrode of the first transistor TR1 while the scan signal GW is activated. Thus, the data signal DATA may be compensated by as much as the threshold voltage of the first transistor TR1. The compensated data signal DATA may be applied to the gate electrode of the first transistor TR1. A uniformity of the driving current ID may be improved by reducing an effect of the threshold voltage of the first transistor TR1.

The storage capacitor CST may include a first electrode to which a first power voltage ELVDD is applied, and may include a second electrode connected to the gate electrode of the first transistor TR1. The storage capacitor CST may maintain a voltage level of the gate electrode of the first transistor TR1 while the scan signal GW is inactivated (while the scan signal GW is not supplied). An emission signal EM may be activated/supplied while the scan signal GW is inactivated. The driving current ID generated by, or supplied by, the first transistor TR1 may be provided to the OLED while the emission signal EM is activated. Therefore, the driving current ID generated by the first transistor TR1 may be provided to the OLED based on the voltage level maintained by the storage capacitor CST.

The fourth transistor TR4 may include a gate electrode, a first electrode, and a second electrode. A data initialization signal GI may be applied to the gate electrode. An initialization voltage VINT may be applied to the first electrode. The second electrode may be connected to the gate electrode of the first transistor TR1. In one embodiment, the first electrode of the fourth transistor TR4 may be a source electrode, and the second electrode of the fourth transistor TR4 may be a drain electrode. In another embodiment, the first electrode of the fourth transistor TR4 may be a drain electrode, and the second electrode of the fourth transistor TR4 may be a source electrode.

The fourth transistor TR4 may apply the initialization voltage VINT to the gate electrode of the first transistor TR1 while the data initialization signal GI is activated/supplied. The fourth transistor TR4 may operate in the linear region. Thus, the fourth transistor TR4 may initialize the gate electrode of the first transistor TR1 with the initialization voltage VINT while the data initialization signal GI is activated. In one embodiment, a voltage level of the initialization voltage VINT may be lower than a voltage level of the data signal DATA maintained by the storage capacitor CST in a previous frame. The first transistor TR1 may be a p-channel metal oxide semiconductor (PMOS)-type transistor. In another embodiment, a voltage level of the initialization voltage VINT may instead be higher than the voltage level of the data signal DATA maintained by the storage capacitor CST in a previous frame, and the first transistor TR1 may be an n-channel metal oxide semiconductor (NMOS)-type transistor.

In one embodiment, the data initialization signal GI may be identical to the scan signal GW but advanced by one horizontal time (e.g., the data initialization signal GI may be supplied prior to the supply of the scan signal GW). For example, the data initialization signal GI is applied to pixels located in the (n)th row, and may be substantially the same as the scan signal GW applied to pixels located in the (n−1)th row. Thus, the data initialization signal GI that is activated may be applied to pixels located in the (n)th row by applying the scan signal GW that is activated to pixels located in the (n−1)th row. In result, the gate electrode of the first transistor TR1 of pixels in the (n)th row may be initialized as the initialization voltage VINT when the scan signal GW is applied to pixels located in the (n−1)th row.

The fifth transistor TR5 may include a gate electrode, a first electrode, and a second electrode. The emission signal EM may be applied to the gate electrode of the fifth transistor TR5. The first power voltage ELVDD may be applied the first electrode of the fifth transistor TR5. The second electrode of the fifth transistor TR5 may be connected to the first electrode of the first transistor TR1. In one embodiment, the first electrode of the fifth transistor TR5 may be a source electrode, and the second electrode of fifth transistor TR5 may be a drain electrode. In another embodiment, the first electrode of the fifth transistor TR5 may be a drain electrode, and the second electrode of the fifth transistor TR5 may be a source electrode.

The fifth transistor TR5 may apply the first power voltage ELVDD to the first electrode of the first transistor TR1 while the emission signal EM is activated (e.g., supplied to the gate electrode of the fifth transistor TR5), and may block the first power voltage ELVDD from the first electrode of the first transistor TR1 while the emission signal EM is inactivated/not supplied. The fifth transistor TR5 may operate in the linear region. The fifth transistor TR5 may apply the first power voltage ELVDD to the first electrode of the first transistor TR1 while the emission signal EM is activated such that the first transistor TR1 generates the driving current ID. In addition, the fifth transistor TR5 may block supply of the first power voltage ELVDD while the emission signal EM is inactivated such that the data signal DATA applied to the first electrode of the first transistor TR1 is applied to the gate electrode of the first transistor TR1.

The sixth transistor TR6 may include a gate electrode, a first electrode, and a second electrode. The emission signal EM may be applied to the gate electrode of the sixth transistor TR6. The first electrode of the sixth transistor TR6 may be connected to the second electrode of the first transistor TR1. The second electrode of the sixth transistor TR6 may be connected to the first electrode of the OLED. In one embodiment, the first electrode of the sixth transistor TR6 may be a source electrode, and the second electrode of sixth transistor TR6 may be a drain electrode. In another embodiment, the first electrode of the sixth transistor TR6 may be a drain electrode, and the second electrode of the sixth transistor TR6 may be a source electrode.

The sixth transistor TR6 may provide the driving current ID generated by the first transistor TR1 to the OLED while the emission signal EM is activated (e.g., supplied to the gate electrode of the sixth transistor TR6). The sixth transistor TR6 may operate in the linear region. Thus, the sixth transistor TR6 may provide the driving current ID generated by the first transistor TR1 to the OLED while the emission signal EM is activated such that the OLED emits the light. In addition, the sixth transistor TR6 may disconnect the first transistor TR1 from the OLED while the emission signal EM is inactivated, such that the compensated data signal DATA applied to the second electrode of the first transistor TR1 is applied to the gate electrode of the first transistor TR1.

The seventh transistor TR7 may include a gate electrode, a first electrode, and a second electrode. A diode initialization signal GB may be applied to the gate electrode of the seventh transistor TR7. The initialization voltage VINT may be applied to the first electrode of the seventh transistor TR7. The second electrode of the seventh transistor TR7 may be connected to the first electrode of the OLED. In one embodiment, the first electrode of the seventh transistor TR7 may be a source electrode, and the second electrode of seventh transistor TR7 may be a drain electrode. In another embodiment, the first electrode of the seventh transistor TR7 may be a drain electrode, and the second electrode of the seventh transistor TR7 may be a source electrode.

The seventh transistor TR7 may apply the initialization voltage VINT to the first electrode of the OLED while the diode initialization signal GB is activated (e.g., supplied to the gate electrode of the seventh transistor TR7. The seventh transistor TR7 may operate in the linear region. Thus, the seventh transistor TR7 may initialize the first electrode of the OLED with the initialization voltage VINT while the diode initialization signal GB is activated. An initial changing amount of the diode parallel capacitor CEL may be calculated according to [Equation 1] below:

$$Qi = CEL \times (VINT - ELVSS) \qquad \text{Equation 1}$$

wherein, Qi is the initial changing amount of the diode parallel capacitor, CEL is a capacitance of the diode parallel capacitor, VINT is a voltage level of the initialization voltage, and ELVSS is a voltage level of the second power voltage.

In one embodiment, the data initialization signal GI and the diode initialization signal GB may be the same signal. An initialization operation of the gate electrode of the first transistor TR1 might not affect an initialization operation of the first electrode of the OLED. Therefore, the data initialization signal GI may be used as the diode initialization signal GB, thereby improving manufacturing efficiency (e.g., by reducing a total number of connections).

A voltage difference between both electrodes of the OLED (e.g., a voltage across the OLED) may be lower than a threshold voltage of the OLED when the OLED does not emit light. The OLED may emit the light when the voltage difference across the OLED is higher than the threshold voltage of the OLED. Therefore, the voltage difference may reach to the threshold voltage, and the light may be emitted when a threshold capacitance is charged in the diode parallel capacitor CEL. The threshold capacitance may be calculated according to [Equation 2] below:

$$Qc = CEL \times Vth \qquad \text{Equation 2}$$

wherein, Qc is the threshold capacitance, CEL is the capacitance of the diode parallel capacitor, and Vth is the threshold voltage of the OLED.

In one embodiment, the driving current ID is not zero (e.g., greater than zero), due to a leakage current generated from the first transistor TR1 when the OLED presents a black color light (i.e., when the grayscale corresponding to the OLED is zero). However the leakage current may flow through the diode parallel capacitor CEL instead of the OLED until the voltage difference between both electrodes of the OLED reach the threshold voltage. The OLED may not emit the light while the diode parallel capacitor CEL is charged by the leakage current, until the threshold capacitance is reached. For example, if the leakage current has a fixed amount, the initialization voltage VINT may be calculated according to [Equation 3] below:

$$VINT \leq ELVSS + Vth - \frac{I_{leak} \times t}{CEL} \qquad \text{Equation 3}$$

wherein, VINT is a voltage level of the initialization voltage, ELVSS is a voltage level of the second power voltage, Vth is the threshold voltage of the OLED, Ileak is an amount of the leakage current, t is a time length for not emitting light in one frame, and CEL is a capacitance of the diode parallel capacitor.

Figure 4:
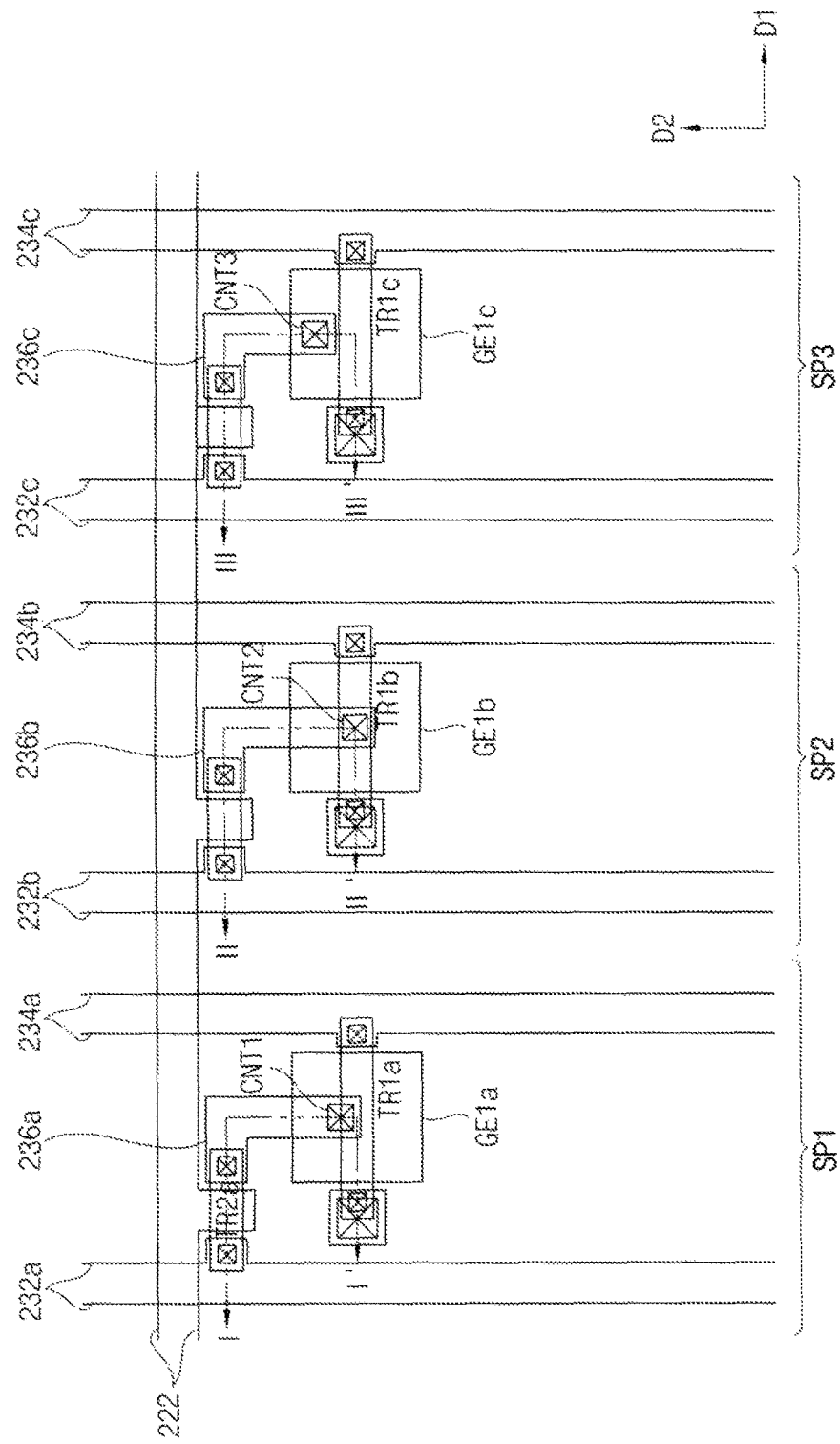
FIG. 4 is a plan view illustrating a display panel according to an embodiment of the inventive concept.
Figure 5A:
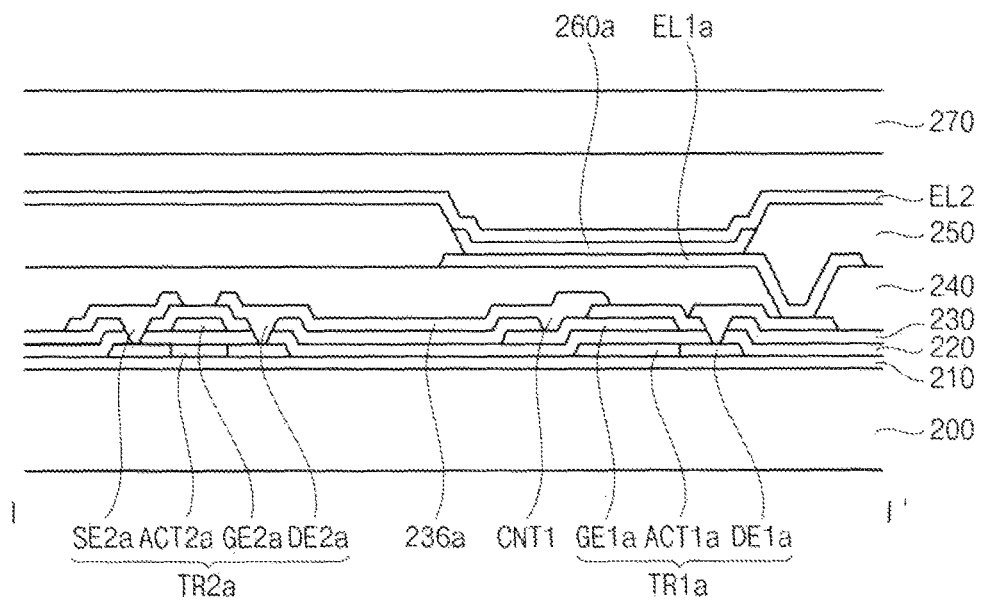
FIG. 5A is a cross-sectional view taken along the line I-I' of FIG. 4.
Figure 5B:
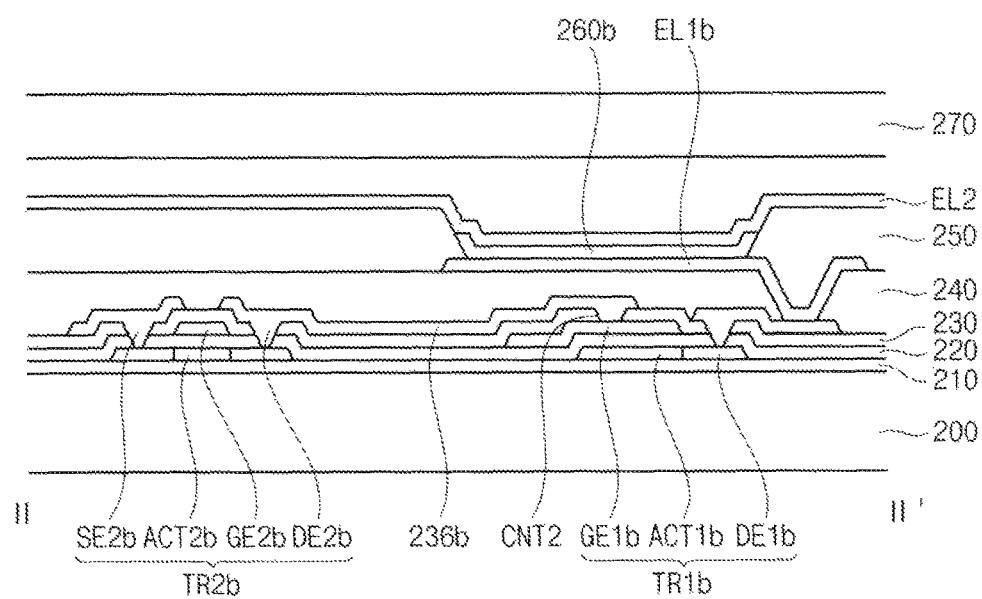
FIG. 5B is a cross-sectional view taken along the line II-II' of FIG. 4.
Figure 5C:
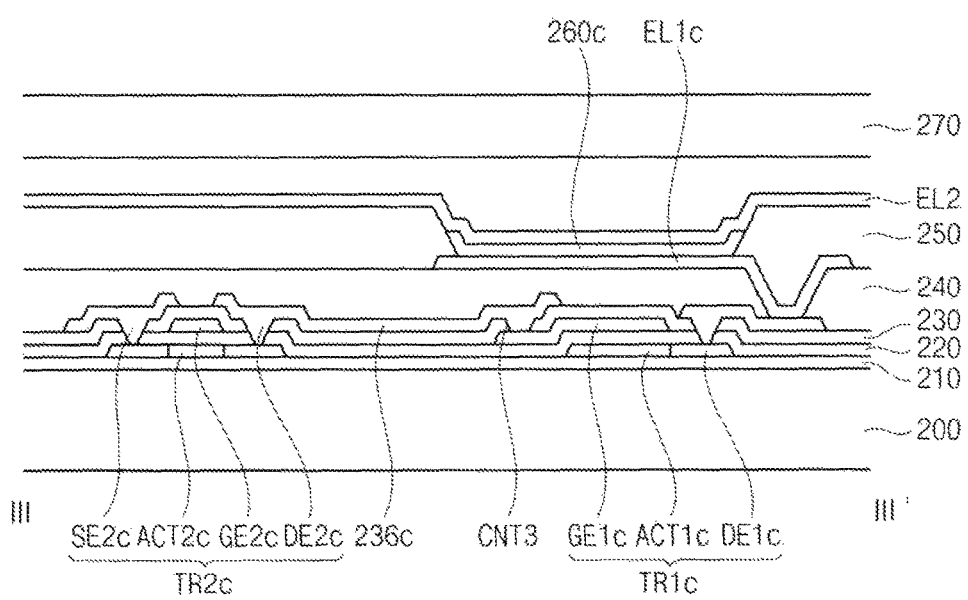
FIG. 5C is a cross-sectional view taken along the line III-III' of FIG. 4.

FIG. 4 is a plan view illustrating a display panel according to an embodiment of the inventive concept. FIG. 5A is a cross-sectional view taken along the line I-I' of FIG. 4. FIG. 5B is a cross-sectional view taken along the line II-II' of FIG. 4. FIG. 5C is a cross-sectional view taken along the line III-III' of FIG. 4.

Referring to FIGS. 4 to 5C, the display panel may include a plurality of unit pixels. Each of the unit pixels includes a first sub-pixel SP1, a second sub-pixel SP2, and a third sub-pixel SP3.

The display panel may include a base substrate 200, a buffer layer 210, an active pattern, a first insulation layer 220, a gate pattern, a second insulation layer 230, a data pattern, a planarization layer 240, a first electrode EL1a, EL1b, and EL1c, a pixel defining layer 250, a light emitting structure 260a, 260b, and 260c, a second electrode EL2, and a sealing substrate 270.

The first sub-pixel SP1, the second sub-pixel SP2, and the third sub-pixel SP3 may have substantially the same structure as another with the exception for differences between first, second, and third contact holes CNT1, CNT2, and CNT3. Thus, only the first sub-pixel SP1 (e.g., FIG. 5A) will be described in detail hereinafter.

The base substrate 200 may include a transparent insulation substrate. The buffer layer 210 may be located on the base substrate 200. The active pattern may be located on the buffer layer 210. The active pattern may include a first active pattern ACT1a of a first transistor TR1a, and may include a second active pattern ACT2a of a second transistor TR2a.

The first insulation layer 220 may be located on the buffer layer 210 covering the active pattern.

The gate pattern may be located on the first insulation layer 220. The gate pattern may include a scan line 222, a first gate electrode GE1a of the first transistor TR1a, and a second gate electrode GE2a of the second transistor TR2a.

The scan line 222 may extend in a first direction D1. The second gate electrode GE2a may be electrically connected to the scan line 122, and may overlap the second active pattern ACT1b. The first gate electrode GE1a may overlap the first active pattern ACT1a.

The second insulation layer 230 may be located on the first insulation layer 220 on which the gate pattern is located.

The data pattern may be located on the second insulation layer 230. The data pattern may include a data line 232a, a driving voltage line 234a, and a first connecting electrode 236a. The data line 232a and the driving voltage line 234a may extend in a second direction D2 that crosses the first direction D1.

The data line 232a may be connected to a second source electrode SE2a. The second source electrode SE2a may be electrically connected to the second active pattern ACT2a though a contact hole formed through the second and first insulation layers 230 and 220. The first connecting electrode 236a may be connected to a second drain electrode DE2a. The second drain electrode DE2a may be electrically connected to the second active pattern ACT2a though a contact hole formed through the second and first insulation layers 230 and 220.

The first connecting electrode 236a may be electrically connected to the first gate electrode GE1a through a first contact hole CNT1 formed through the second insulation layers 230. The driving voltage line 234a may be connected to a first source electrode of the first transistor TR1a. The first source electrode of the first transistor TR1a may be electrically connected to the first active pattern ACT1a through a contact hole formed through the second and first insulation layers 230 and 220. A first drain electrode DE1a of the first transistor TR1a may be electrically connected to the first active pattern ACT1a through a contact hole formed through the second and first insulation layers 230 and 220.

In addition, in the first sub-pixel SP1, the first contact hole CNT1 may overlap a portion of the first active pattern ACT1a. In the second sub-pixel SP2, the second contact hole CNT2 may entirely overlap the second active pattern ACT1b. In the third sub-pixel SP3, the third contact hole CNT3 might not overlap the third active pattern ACT1c. Thus, a distance between the second active pattern ACT1b and the second contact hole CNT2 in the second sub-pixel SP2 may be less than corresponding distances in the first and third sub-pixels SP1 and SP3. A distance between the first active pattern ACT1a and the first contact hole CNT1 in the first sub-pixel SP1 may be less than a distance between the third active pattern ACT1c and the third contact hole CNT3 in the third sub-pixel SP3.

The planarization layer 240 may be located on the second insulation layer 230 on which the data pattern is located. The first electrode EL1a may be located on the planarization layer 240. The first electrode EL1a may be electrically connected to the first drain electrode DE1a through a via hole formed through the planarization layer 240. The pixel defining layer 250 may be located on the planarization layer 240 on which the first electrode EL1a is located.

The light emitting structure 260a may be positioned on the first electrode EL1a, which is exposed by the opening of the pixel defining layer 250. For example, an organic light emitting layer of the light emitting structure 260a in the first sub-pixel SP1 may be formed using light emitting materials for generating red light, an organic light emitting layer of the light emitting structure 260b in the second sub-pixel SP2 may be formed using light emitting materials for generating green light, and an organic light emitting layer of the light emitting structure 260c in the third sub-pixel SP3 may be formed using light emitting materials for generating blue light.

The second electrode EL2 may be located on the light emitting structure 260a and the pixel defining layer 250. The sealing substrate 270 may be located on the second electrode EL2.

Figure 6:
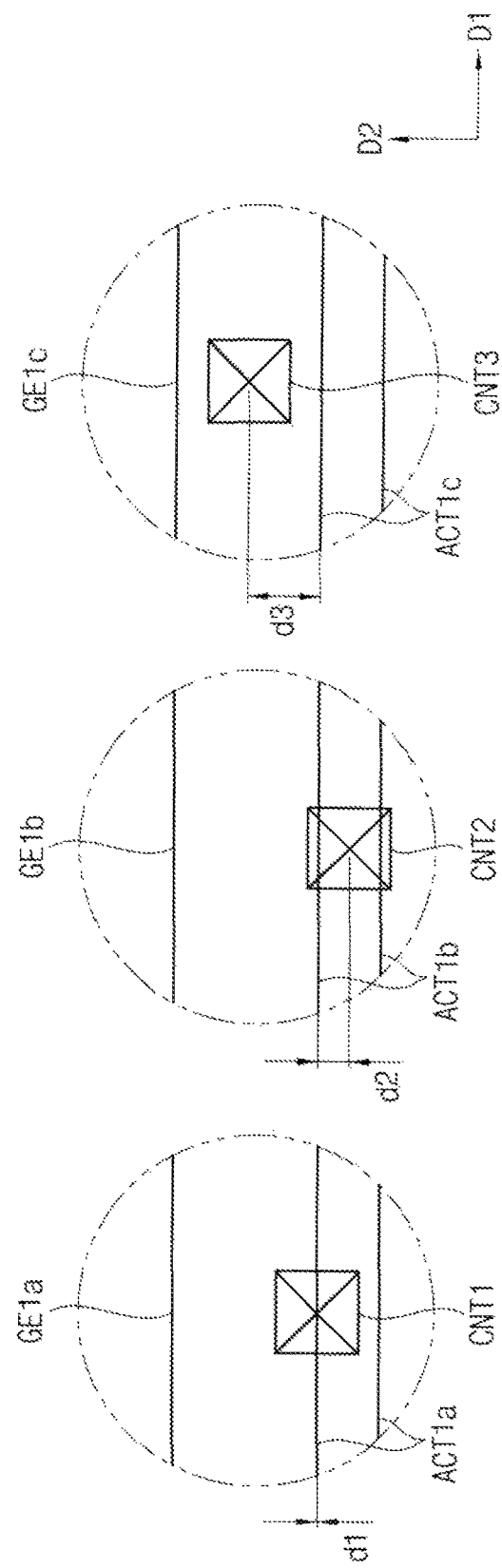
Figure 7:
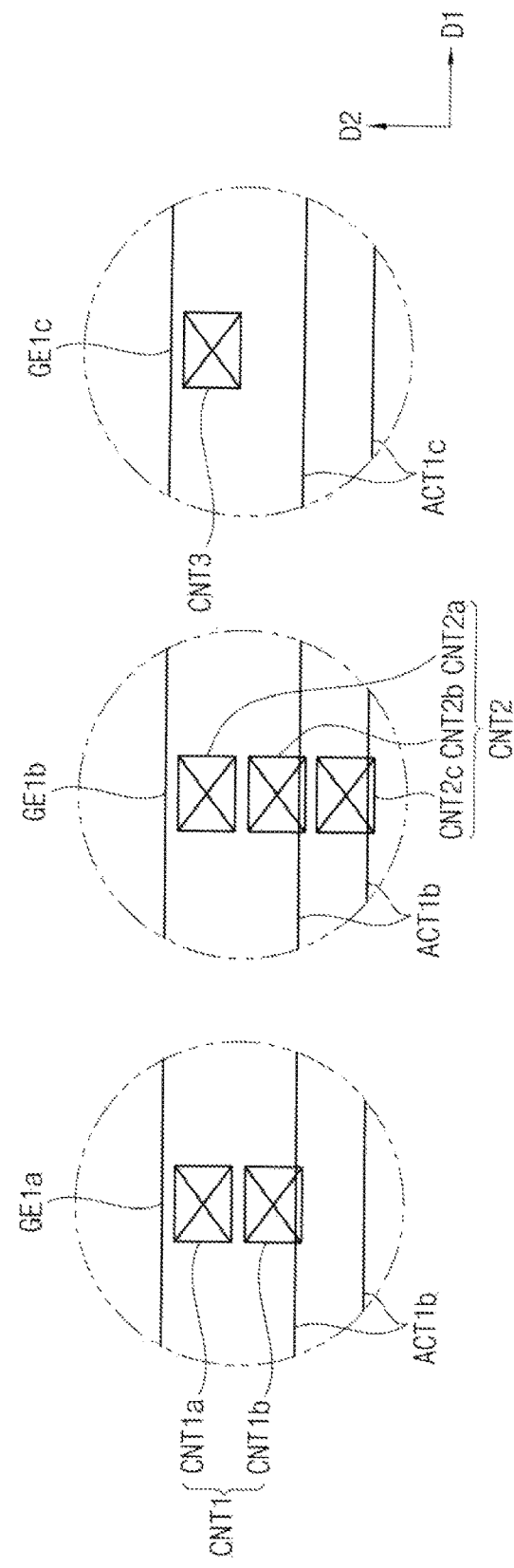

FIGS. 6 to 8 are enlarged views illustrating portions of a display panel respectively surrounding first to third contact holes according to some embodiments of the inventive concept.

Referring to FIG. 6, in the first sub-pixel (e.g., first sub-pixel SP1), a first distance d1 may be defined as a distance in the second direction D2 (e.g., +y-direction) from a boundary, or edge, of the first active pattern ACT1a to a center of the first contact hole CNT1. In the second sub-pixel (e.g., second sub-pixel SP2), a second distance d2 may be defined as a distance in the second direction D2 from a boundary/edge of the second active pattern ACT1b to a center of the second contact hole CNT2. In the third sub-pixel (e.g., third sub-pixel SP3), a third distance d3 may be defined as a distance in the second direction D2 from a boundary/edge of the first active pattern ACT1c to a center of the second contact hole CNT3.

When the first sub-pixel is a red pixel, the second sub-pixel is a green pixel, and the third sub-pixel is a blue pixel, the first distance d1 may be greater than the second distance d2, and the first distance d1 may be less than the third distance d3. For example, when the first distance d1 is zero, the second distance d2 may have negative value, and the third distance d3 may have positive value. Thus, the first contact hole CNT1 may partially overlap the first active pattern ACT1a, the second contact hole CNT2 may overlap (e.g., entirely overlap) the second active pattern ACT1b, and the third contact hole CNT3 may be formed to not overlap the third active pattern ACT1c.

Accordingly, an overlapped area of the first contact holes CNT1 and the first active pattern ACT1a (e.g., an area at which the first contact holes CNT1 overlap the third active pattern ACT1), an overlapped area of the second contact holes CNT2 and the second active pattern ACT1b, and an overlapped area of the third contact holes CNT3 and the third active pattern ACT1c (which might not exist) may be different from each other.

Here, the first to third distance d1, d2, and d3 may be determined in consideration of differing luminous efficiency of the EL layer of the light emitting structures of the different sub-pixels. For example, when a luminous efficiency of green EL layer is better than a luminous efficiency of red EL layer, and the luminous efficiency of red EL layer is better than a luminous efficiency of blue EL layer, smaller distances of the first to third distance d1, d2, d3 may correspond to higher luminous efficiency. Thus, the second distance d2 may be smaller than the first distance d1, and the first distance d1 may be set to be smaller than the third distance d3. In the present embodiment, the second distance d2 has negative value, the first distance d1 is equal to zero, and the third distance d3 has positive value.

Referring to FIG. 7, in a first sub-pixel, a first contact hole(s) CNT1 may include first sub-contact hole CNT1a and a second sub-contact hole CNT1b. In a second sub-pixel, a second contact hole(s) CNT2 may include a first sub-contact hole CNT2a, a second sub-contact hole CNT2b, and a third sub-contact hole CNT2c. In a third sub-pixel, a third contact hole CNT3 may be formed as a single contact hole.

Accordingly, overlapped areas of the first contact holes CNT1 and a first active pattern ACT1a, overlapped areas of the second contact holes CNT2 and a second active pattern ACT1b, and an overlapped area of the third contact hole CNT3 and a third active pattern ACT1c may be different from each other.

Here, the number of the sub-contact holes may be determined in consideration of luminous efficiency of the corresponding EL layer of the light emitting structures of the sub-pixels. For example, when a luminous efficiency of green EL layer is better than a luminous efficiency of red EL layer, and when the luminous efficiency of red EL layer is better than a luminous efficiency of blue EL layer, a greater number of the sub-contact holes may correspond to higher luminous efficiency. Thus, the number of the second sub-contact holes CNT2 is greater than the number of the first sub-contact holes CNT1, which is in turn greater than the number of the third contact hole CNT3. In the present embodiment, there are three second sub-contact holes CNT2, there are two first sub-contact holes CNT1, and there is only one third contact hole CNT3.

Referring to FIG. 8, a size of a second contact hole CNT2 of a second sub-pixel is greater than a size of a first contact hole CNT1 of a first sub-pixel, and the size of the first contact hole CNT1 of the first sub-pixel is greater than a size of a third contact hole CNT3 of a third sub-pixel.

Accordingly, an overlapped area of the first contact hole(s) CNT1 and a first active pattern ACT1a, an overlapped area of the second contact hole(s) CNT2 and a second active pattern ACT1b, and an overlapped area of the third contact hole(s) CNT3 and a third active pattern ACT1c may be different from each other.

Here, the size of the contact holes may correspond to a luminous efficiency of an EL layer of the light emitting structures of the respective sub-pixels. For example, when a luminous efficiency of a green EL layer is better than a luminous efficiency of a red EL layer, and when the luminous efficiency of the red EL layer is better than a luminous efficiency of a blue EL layer, a larger-sized contact hole may correspond to a higher luminous efficiency. Thus, the second contact hole CNT2 is larger than the first contact hole CNT1, and the first contact hole CNT1 is larger than the third contact hole CNT3.

Figure 9B:
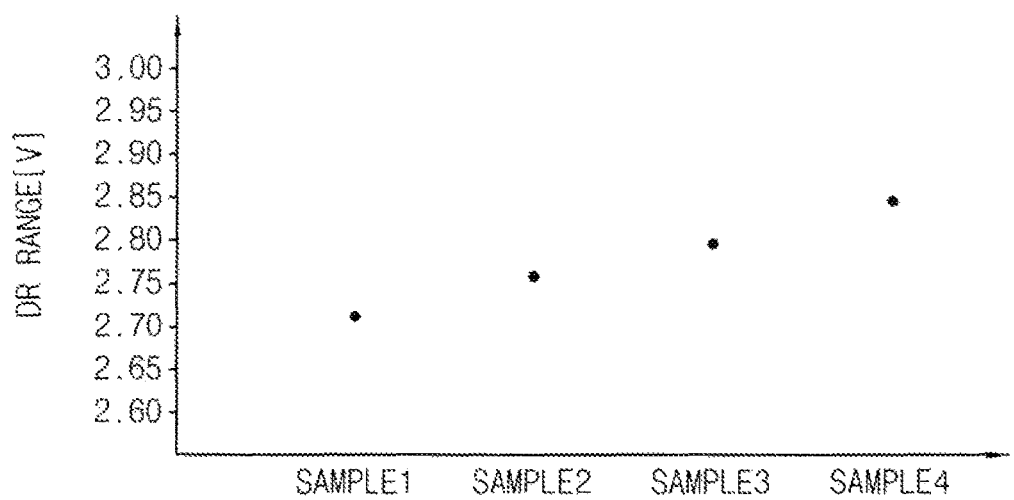
Figure 11A:
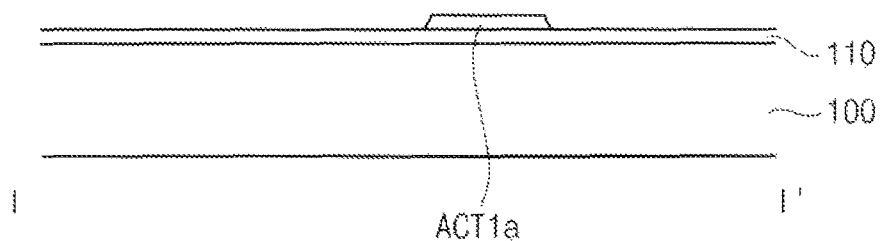
Figure 11B:
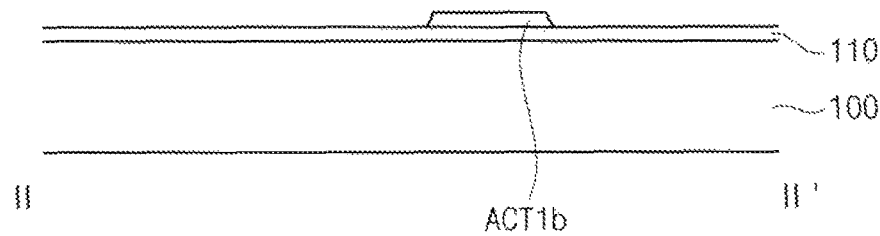
Figure 11C:
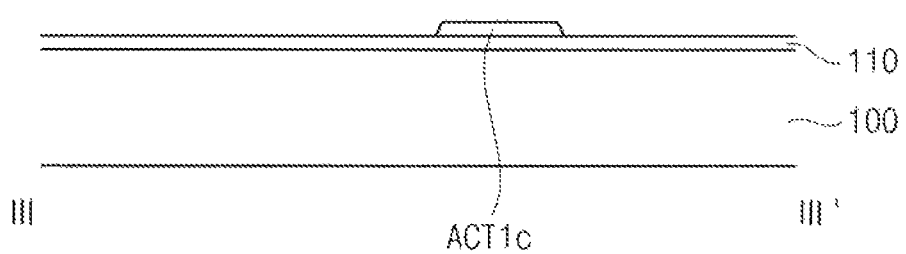
Figure 12:
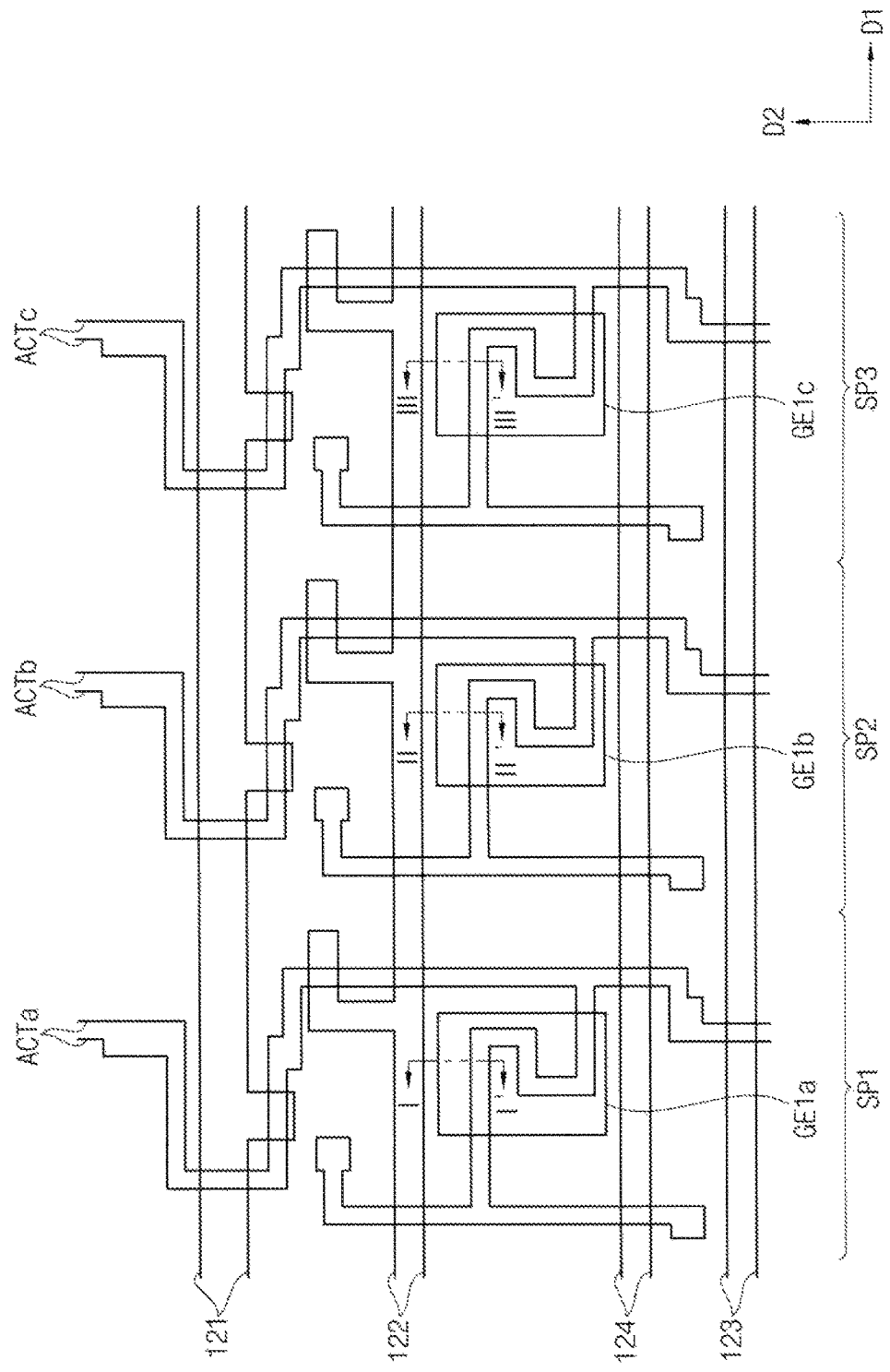
Figure 13A:
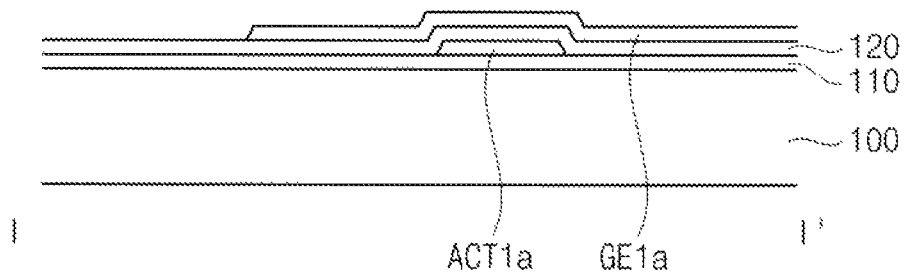
Figure 13B:
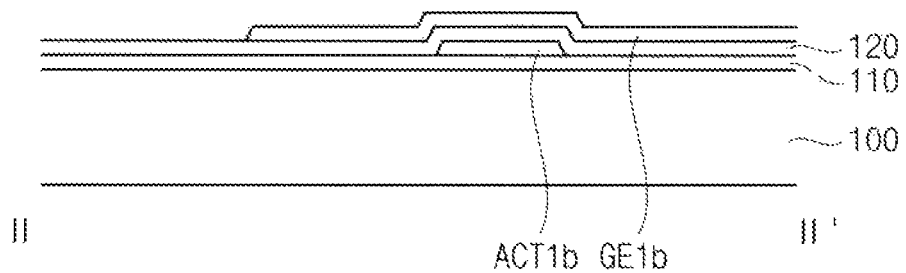
Figure 13C:
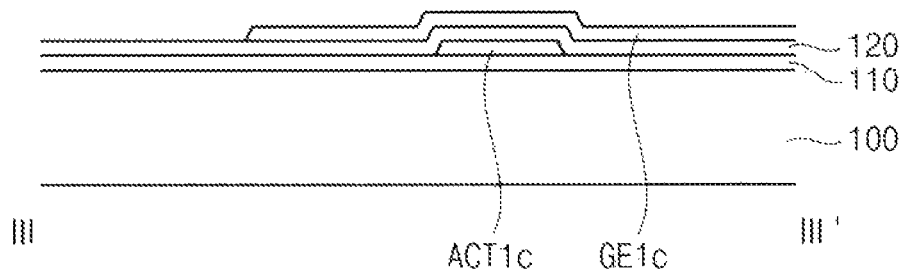
Figure 14:
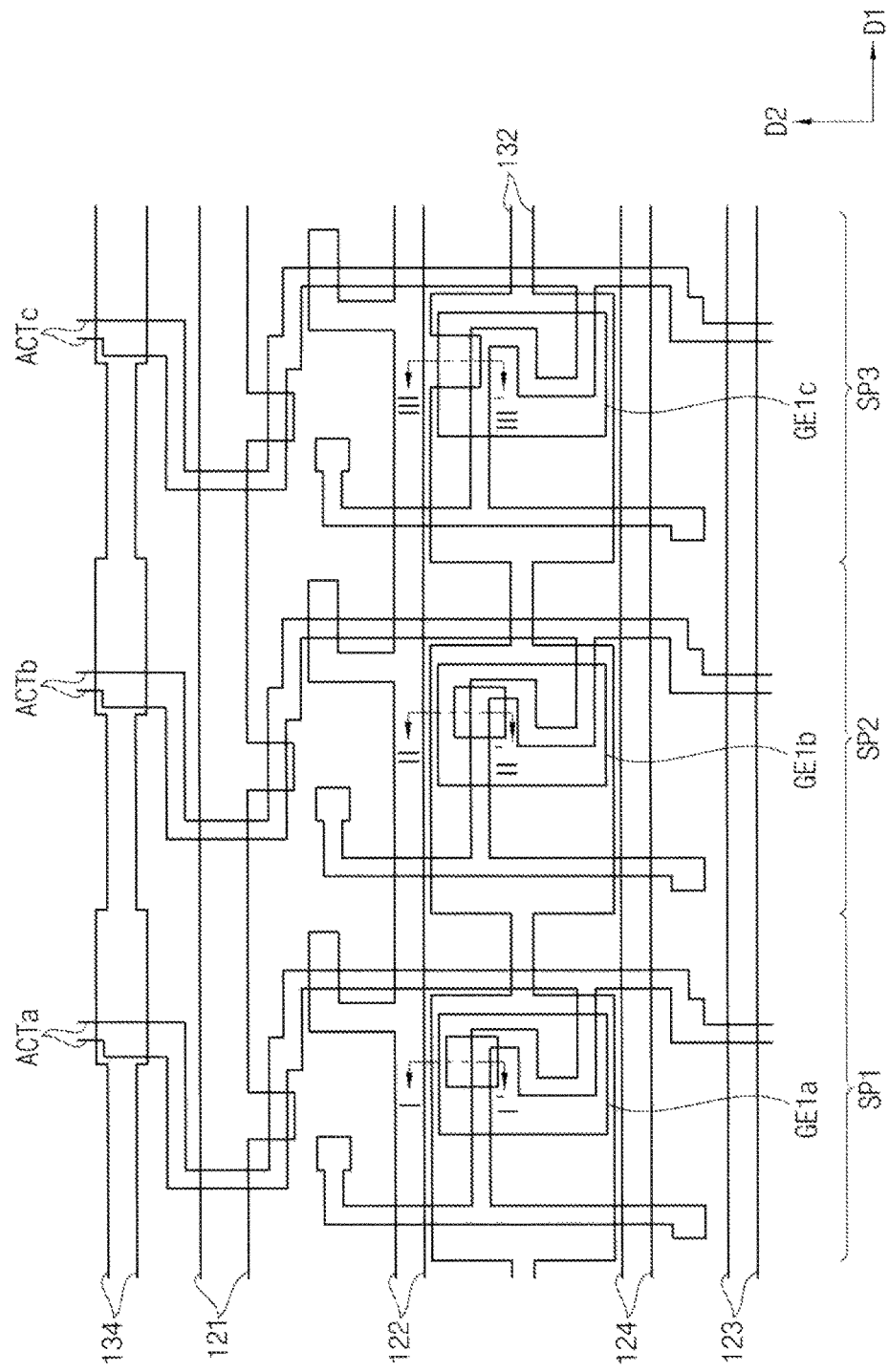
Figure 15A:
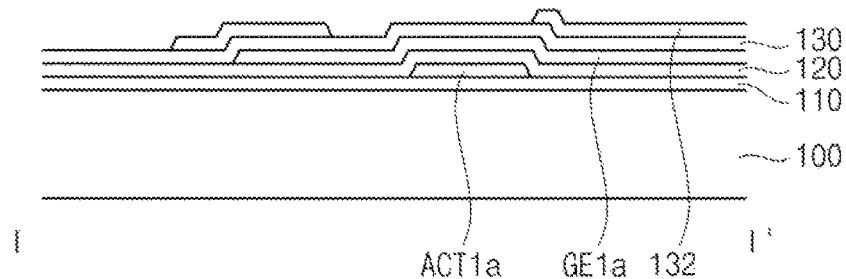
Figure 15B:
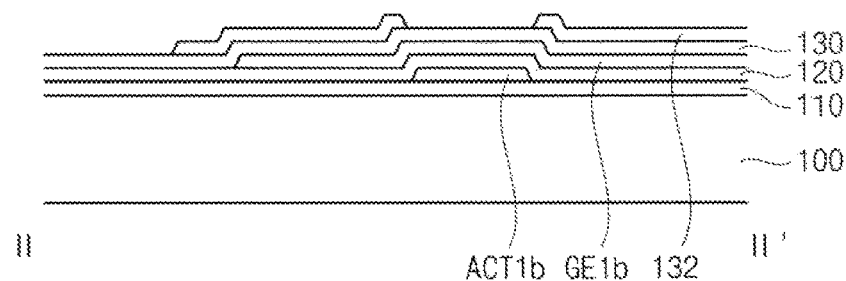
Figure 15C:
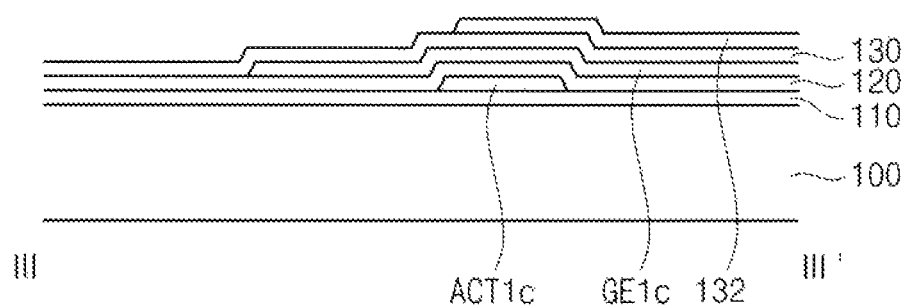
Figure 16:
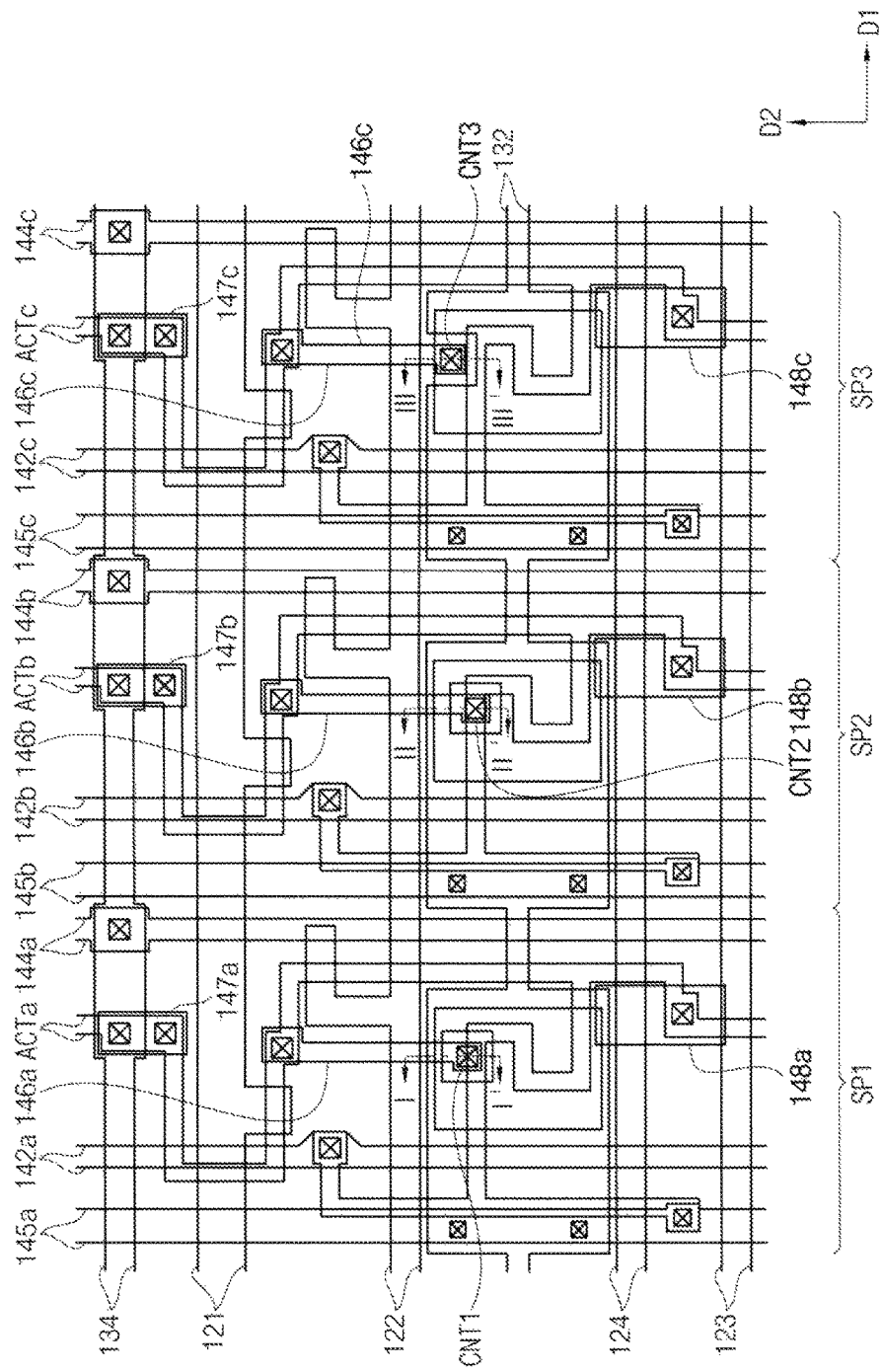
Figure 17A:
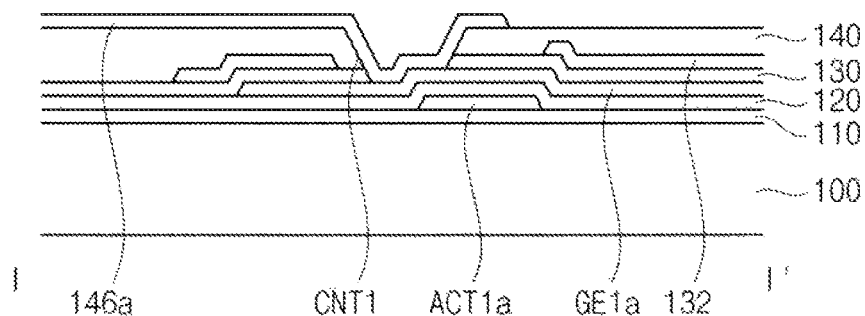
Figure 17B:
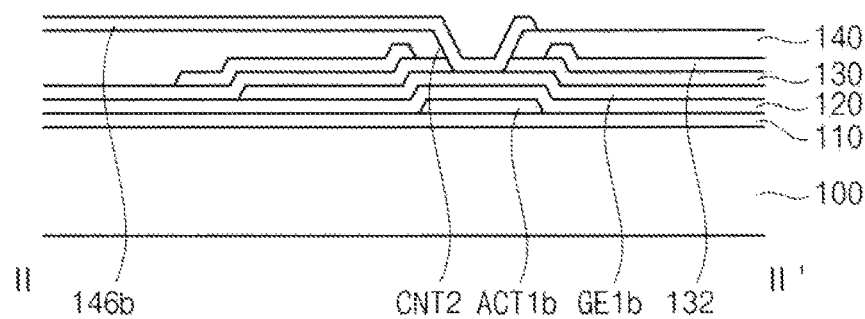
Figure 17C:
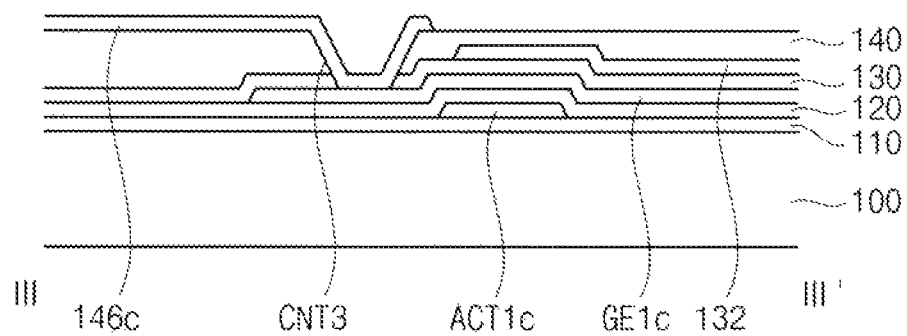
Figure 18:
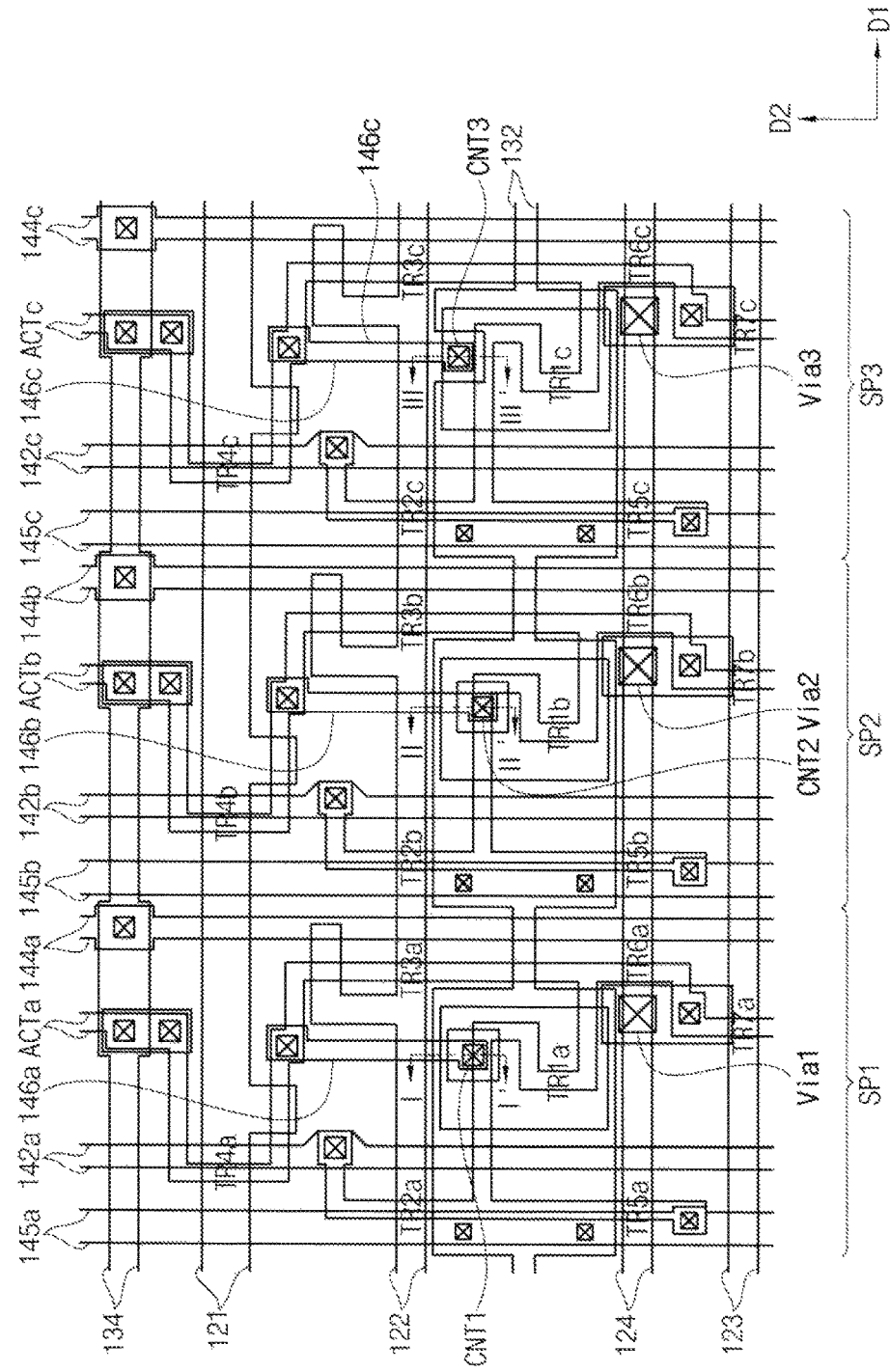
Figure 19A:
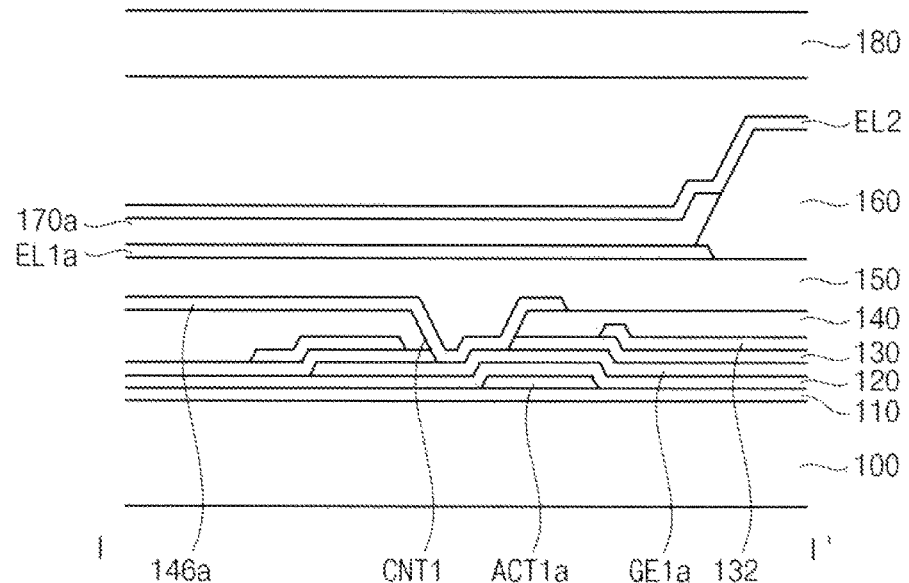
Figure 19B:
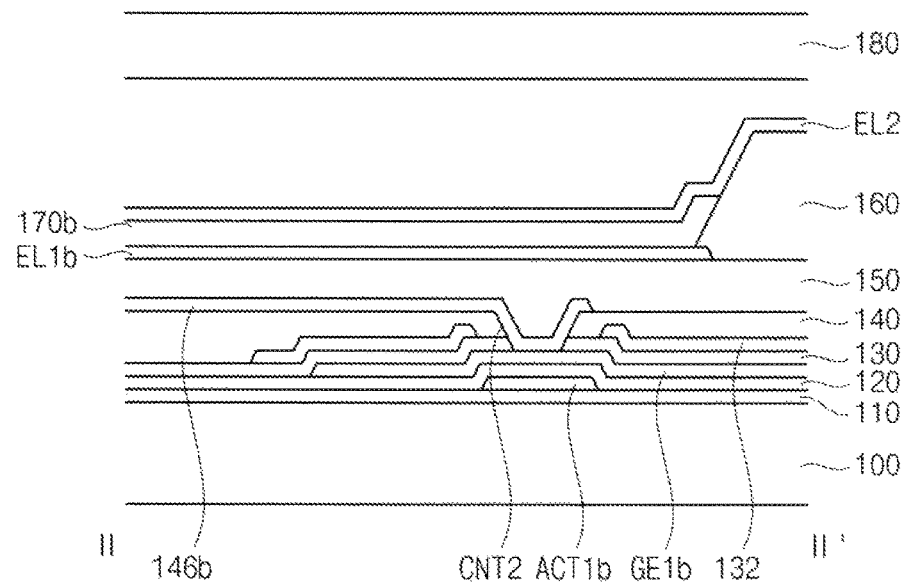
Figure 19C:
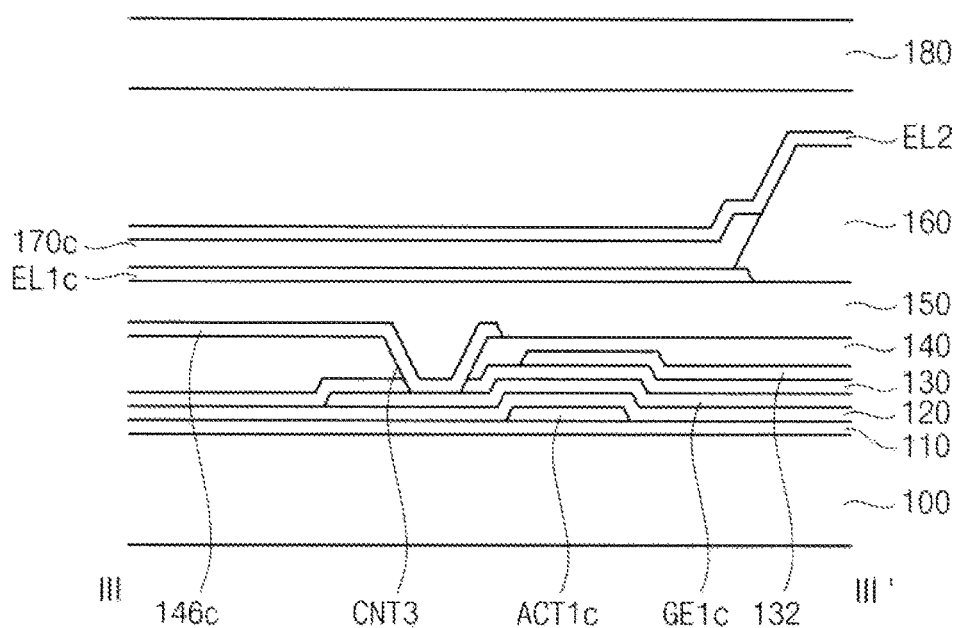

FIGS. 9A and 9B are figures and a graph illustrating DR range of thin film transistors according to position of a contact hole.

Referring to FIGS. 9A and 9B, DR range according to a degree of overlap of an active pattern and a contact hole (e.g., according to a size of an overlapped area) is described.

In samples 1 to 4, a degree of overlap of the active pattern and the contact hole are set to be different from each other. For example, an overlapped area of the contact hole and the active pattern is increasingly bigger from the sample 1 to the sample 4. As shown by experiment results, the DR range of the transistor may change according to the position of the contact hole. For example, when the overlapped area of the contact hole and the active pattern is increasingly bigger in order of the sample 1, the sample 2, the sample 3, and the sample 4, the DR range of the transistor is increasingly bigger in order of the sample 1, the sample 2, the sample 3, and the sample 4. Thus, as relative position of the contact hole with respect to the active pattern is changed, on/off voltage of the corresponding transistor is changed.

According to the experiment results, as the degree of overlap of the contact hole and the active pattern increases, DR range of the transistor also increases. Generally, range of input data voltage of a sub-pixel that has higher luminous efficiency is narrower than that of other sub-pixels having relatively lower luminous efficiency. However, in the present embodiments, a suitable data voltage range may be widened by enlarging the overlapped area as compared to other sub-pixels. Thus, even though the sub-pixels have luminous efficiency that is different from each other, deviation or variation of data voltage ranges for the sub-pixels may be reduced or minimized by setting the positions of the contact holes. Accordingly, color deviation or variation of a display apparatus may be reduced, so that display quality may be improved.

FIGS. 10 to 19B are plan views and cross-sectional views illustrating a method of manufacturing the display panel of FIG. 1.

Referring to FIGS. 10, 11a, 11b, and 11c, a buffer layer 110 may be formed on the base substrate 100. The buffer layer 110 may be formed by a spin coating process, a chemical vapor deposition (CVD) process, a plasma enhanced chemical vapor deposition (PECVD) process, a high density plasma-chemical vapor deposition (HDP-CVD) process, a printing process, etc.

An active pattern(s) ACT1a, ACT1b, and ACT1c may be formed on the buffer layer 110. A semiconductor layer may be formed on the buffer layer 110, and then a preliminary active layer may be formed on the buffer layer 110 by patterning the semiconductor layer. A crystallization process may be performed about the preliminary active layer to form the active patterns ACT1a, ACT1b and ACT1c on the buffer layer 110. Here, the semiconductor layer may be formed by a CVD process, a PECVD process, a low pressure chemical vapor deposition (LPCVD) process, a sputtering process, a printing process, etc. When the semiconductor layer includes amorphous silicon, the active pattern may include polysilicon. The crystallization process for forming the active pattern may include a laser irradiation process, a thermal treatment process, a thermal process utilizing a catalyst, etc. In some embodiments, a dehydrogenation process may be performed about the semiconductor layer and/or the preliminary active layer after forming the semiconductor layer and/or the preliminary active layer on the buffer layer 110. The dehydrogenation process may reduce the hydrogen concentration of the semiconductor layer and/or the preliminary active layer, so that the active pattern ACT1a, ACT1b, and ACT1c may have improved electrical characteristics.

Referring to FIGS. 12, 13A, 13B, and 13C, a first insulation layer 120 may be formed on the buffer layer 110 on which the active patterns ACT1a, ACT1b, and ACT1c are formed. A first gate pattern may be formed on the first insulation layer 120. A first conductive layer may be formed on the first insulation layer 120, and then the first conductive layer may be partially etched by a photolithography process or an etching process using an additional etching mask. Hence, the first gate pattern may be provided on the first insulation layer 120. The first conductive layer may be formed by a printing process, a sputtering process, a CVD process, a pulsed laser deposition (PLD) process, a vacuum evaporation process, an atomic layer deposition (ALD) process, etc.

The first gate pattern may include a data initialization line 121, a scan line 122, a bypass control line 123, an emission control line 124, and a first gate electrode GE1a, GE1b, and GE1c of the first transistor TR1a, TR1b, and TR1c, respectively.

Referring to FIGS. 14, 15A, 15B, and 15C, a second insulation layer 130 may be formed on the first insulation layer 120 on which the first gate pattern is formed. The second insulation layer 130 may be formed by a spin coating process, a CVD process, a PECVD process, a HDP-CVD process, a printing process, etc.

A second gate pattern may be formed on the second insulation layer 130. A second conductive layer may be formed on the second insulation layer 130, and then the second conductive layer may be partially etched by a photolithography process or an etching process using an additional etching mask. Hence, the second gate pattern may be provided on the second insulation layer 130. The second conductive layer may be formed by a printing process, a sputtering process, a CVD process, a PLD process, a vacuum evaporation process, an ALD process, etc.

The second gate pattern may include a storage electrode line 132 and an auxiliary initialization voltage line 134.

Referring to FIGS. 16, 17A, 17B, and 17C, a third insulation layer 140 may be formed on the second insulation layer 130 on which the second gate pattern is formed. The third insulation layer 140 may be obtained by a spin coating process, a printing process, a sputtering process, a CVD process, an ALD process, a PECVD process, an HDP-CVD process or a vacuum evaporation process in accordance with ingredients/materials included in the third insulation layer 140.

In embodiments, a planarization process may be executed on the third insulation layer 140 to enhance the flatness of the third insulation layer 140. For example, the third insulation layer 140 may have a substantially level surface by a chemical mechanical polishing (CMP) process, an etch-back process, etc.

Then, a plurality of contact holes, which exposes the active pattern, the first gate pattern, and the second gate pattern, may be formed through the first to third insulation layers 120, 130, and 140. For example, first to third contact holes CNT1, CNT2, and CNT3, which respectively expose the first gate electrodes GE1a, GE1b, and GE1c, may be formed through the third insulation layer 140 and the second insulation layer 130.

A data pattern may be formed on the third insulation layer 140. A third conductive layer may be formed on the third insulation layer 140 to fill the contact holes. After that, the data pattern may be obtained by patterning the third conductive layer. The third conductive layer may be formed by a printing process, a sputtering process, a CVD process, a PLD process, a vacuum evaporation process, an ALD process, etc.

The data pattern may include a data line 142a, an initialization voltage line 144a, a driving voltage line 145a, a first connecting electrode 146a, a second connecting electrode 147a, and a third connecting electrode 148a. The data pattern may also include data lines 142b and 142c, initialization voltage lines 144b and 144c, driving voltage lines 145b and 145c, first connecting electrodes 146b and 146c, second connecting electrodes 147b and 147c, and third connecting electrodes 148b and 148c.

Referring to FIGS. 18, 19A, 19B, and 19C, a planarization layer 150 may be formed on the third insulation layer 140 on which the data pattern is formed. The planarization layer 150 may be formed by a spin coating process, a printing process, a sputtering process, a CVD process, an ALD process, a PECVD process, an HDP-CVD process or a vacuum evaporation process in accordance with ingredients/materials included in the planarization layer 150.

First to third via holes Via1, Via2 and Via3, which expose a respective one of the second connecting electrodes 147a, 147b, and 147c, may be formed.

A first electrode EL1a (e.g., EL1a, EL1b, and EL1c) may be formed on the planarization layer 150. A fourth conductive layer may be formed on the planarization layer 150 to fill the via holes Via1, Via2, and Via3. After that, the first electrode EL1a may be obtained by patterning the fourth conductive layer. The fourth conductive layer may be formed by a sputtering process, a CVD process, a PLD process, a vacuum evaporation process, an ALD process, a printing process, and etc.

A pixel defining layer 160 may be formed on the first electrode EL1a (e.g., first electrodes EL1a, EL1b, and EL1c).

The pixel defining layer 160 may be obtained by a spin coating process, a spray process, a printing process, a CVD process, a PECVD process, an HDP-CVD process, etc. In embodiments, the pixel defining layer 160 may be partially etched to form an opening partially exposing the first electrode EL1a. The opening of the pixel defining layer 160 may define a luminescent region and a non-luminescent region of the display apparatus. For example, a portion of the display apparatus having the opening of the pixel defining layer 60 may be a corresponding luminescent region of the display device, while another portion of (e.g., a remainder of) the display apparatus around the opening of the pixel defining layer 160 may be the non-luminescent region of the display device.

The light emitting structure 170a (e.g., light emitting structures 170a, 170b, and 170c) may be formed on the first electrode EL1a (e.g., on a corresponding one of the first electrodes EL1a, EL1b, and EL1c) exposed by the opening(s) of the pixel defining layer 160. The light emitting structure 170a may be formed by a laser induced thermal imaging process, a printing process, etc.

The second electrode EL2 may be formed on the light emitting structure 170a (e.g., on the light emitting structures 170a, 170b, and 170c) and on the pixel defining layer 160. The second electrode EL2 may be formed by a printing process, a sputtering process, a CVD process, an ALD process, a vacuum evaporation process, a PLD process, etc.

The sealing substrate 180 may be displayed on the second electrode EL2. The sealing substrate 180 may include a resin, for example, photoresist, acryl-based resin, polyimide-based resin, polyamide-based resin, siloxane-based resin, etc. These may be used alone or in a combination thereof.

According to the present inventive concept, a display panel includes a first sub-pixel that includes a first transistor, a second sub-pixel that includes a second transistor, and a third sub-pixel that includes a third transistor. Each of the first to third transistors includes a gate electrode, and the gate electrode may be electrically connected to other elements through first to third contact holes. Relative positions of the first to third contact holes in each of the sub-pixels may be set to be different from each other. Thus, even though the sub-pixels have luminous efficiency different from each other, deviation or variation of data voltage ranges for the sub-pixels may be minimized by setting the positions of the contact holes. Accordingly, color deviation of a display apparatus may be reduced, so that display quality may be improved.

The foregoing is illustrative of the inventive concept and is not to be construed as limiting thereof. Although a few embodiments of the inventive concept have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. In the claims, means-plus-function clauses are intended to cover the structures described herein as performing the recited function and not only structural equivalents but also equivalent structures. Therefore, it is to be understood that the foregoing is illustrative of the inventive concept and is not to be construed as limited to the specific embodiments disclosed, and that modifications to the disclosed embodiments, as well as other embodiments, are intended to be included within the scope of the appended claims. The inventive concept is defined by the following claims, with equivalents of the claims to be included therein.

What is claimed is:

1. A display panel comprising:
a base substrate;
an active pattern disposed on the base substrate, and comprising a first active area of a first transistor and a second active area of a second transistor;
a gate pattern disposed on the base substrate, and comprising a first gate electrode that overlaps the first active area, and a second gate electrode that overlaps the second active area;
an insulation layer disposed on the gate pattern and configured to cover the gate pattern;
a first conductive pattern disposed on the insulation layer and electrically connected to the first gate electrode through a first contact hole formed through the insulation layer; and
a second conductive pattern electrically connected to the second gate electrode through a second contact hole formed through the insulation layer,
wherein a size of a first overlapped area at which the first active area overlaps the first contact hole is different from a size of a second overlapped area at which the second active area overlaps the second contact hole.

2. The display panel of claim 1, further comprising:
a first light emitting structure electrically connected to the first transistor, and configured to emit a first color light; and
a second light emitting structure electrically connected to the second transistor, and configured to emit a second color light.

3. The display panel of claim 2, wherein a first distance between the first contact hole and the first active area is different from a second distance between the second contact hole and the second active area.

4. The display panel of claim 2, wherein the first contact hole comprises at least one first sub-contact hole,
wherein the second contact hole comprises at least one second sub-contact hole, and
wherein a number of the at least one first sub-contact hole is different from a number of the at least one second sub-contact hole.

5. The display panel of claim 2, wherein a size of the first contact hole is different from a size of the second contact hole.

6. The display panel of claim 1, further comprising
a third conductive pattern electrically connected to a third gate electrode of a third transistor through a third contact hole formed through the insulation layer, wherein the active pattern further comprises a third active area of the third transistor, wherein the gate pattern further comprises the third gate electrode of the third transistor, and wherein the first overlapped area, the second overlapped area, and a third overlapped area at which the third active area overlaps the third contact hole are different from each other.

7. The display panel of claim 6, further comprising:

a first light emitting structure electrically connected to the first transistor, and configured to emit a first color light;

a second light emitting structure electrically connected to the second transistor, and configured to emit a second color light; and a third light emitting structure electrically connected to the third transistor, and configured to emit a third color light.

8. The display panel of claim 7, wherein the first color light is red light, wherein the second color light is green light, and wherein the third color light is blue light.

9. The display panel of claim 8, wherein a second distance between the second contact hole and the second active area is greater than a first distance between the first contact hole and the first active area, and wherein a third distance between the third contact hole and the third active area is greater than the first distance.

10. The display panel of claim 8, wherein the first contact hole comprises at least one first sub-contact hole, wherein the second contact hole comprises at least one second sub-contact hole, wherein the third contact hole comprises at least one third sub-contact hole, and wherein a number of the at least one second sub-contact hole is greater than a number of the at least one first sub-contact hole, which is greater than a number of the at least one third sub-contact hole.

11. The display panel of claim 8, wherein a size of the second contact hole is greater than a size of the first contact hole, which is greater than a size of the third contact hole.

12. The display panel of claim 8, wherein the second overlapped area is greater than the first overlapped area, and wherein the first overlapped area is greater than the third overlapped area.

13. The display panel of claim 12, wherein the first contact hole is partially overlapped with the first active area, the second contact hole is totally overlapped with the second active area, and the third contact hole is not overlapped with the third active area.

14. The display panel of claim 1, wherein the first contact hole overlaps the first active area.

15. The display panel of claim 1, further comprising a data line on the base substrate, and at a same layer as the first conductive pattern and the second conductive pattern.

16. The display panel of claim 15, further comprising a storage electrode line overlapping the first gate electrode and the second gate electrode, and defining openings corresponding to the first and second contact holes.

17. A display panel, comprising first and second sub-pixels that emit different color light, wherein the first sub-pixel comprises a first transistor comprising a first gate electrode, wherein the second sub-pixel comprises a second transistor comprising a second gate electrode, wherein a size of the first transistor is substantially the same as a size of the second transistor, and wherein a relative position of a first contact hole that exposes the first gate electrode in the first transistor is different from relative position of a second contact hole that exposes the second gate electrode in the second transistor.

* * * * *